US012805024B2

(12) United States Patent
Kang et al.

(10) Patent No.: US 12,805,024 B2
(45) Date of Patent: Nov. 17, 2026

(54) BACKSIDE CONTACTS TO CONTROL THE VOLTAGE OF THE SUBSTRATE

(71) Applicant: INTERNATIONAL BUSINESS MACHINES CORPORATION, Armonk, NY (US)

(72) Inventors: Tsung-Sheng Kang, Ballston Lake, NY (US); Tao Li, Slingerlands, NY (US); Ruilong Xie, Niskayuna, NY (US); Robert Gauthier, Williston, VT (US); Anindya Nath, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 338 days.

(21) Appl. No.: 18/631,016

(22) Filed: Apr. 9, 2024

(65) Prior Publication Data

US 2025/0318277 A1 Oct. 9, 2025

(51) Int. Cl.
*H10D 89/60* (2025.01)
*H10W 20/00* (2026.01)
*H10W 20/41* (2026.01)

(52) U.S. Cl.
CPC .......... *H10D 89/713* (2025.01); *H10W 20/01* (2026.01); *H10W 20/435* (2026.01)

(58) Field of Classification Search
None
See application file for complete search history.

(56) References Cited

U.S. PATENT DOCUMENTS 7,595,537 B2 9/2009 Kodama
8,853,783 B2 10/2014 Lai
10,854,596 B2 12/2020 Gorbachov
11,127,733 B2 9/2021 Schmenn
11,652,107 B2 5/2023 Thomson
2010/0059869 A1 3/2010 Kaskoun
2010/0091475 A1 4/2010 Toms
2013/0168772 A1* 7/2013 Wen .................... H10D 89/815 257/355
2021/0305809 A1 9/2021 Hung
2022/0102266 A1* 3/2022 Lim ...................... H10W 20/20
2023/0042548 A1* 2/2023 Yang .................. H10W 20/069
2023/0223455 A1* 7/2023 Liaw ................. H10D 30/6735 257/288
2023/0344395 A1* 10/2023 Nuzum .................. H03F 3/195
2024/0055433 A1* 2/2024 Liaw ..................... G06F 30/392
2024/0395900 A1* 11/2024 Yun ...................... H10D 64/017

FOREIGN PATENT DOCUMENTS

EP 4164127 A1 4/2023
JP 5917639 B2 5/2016

OTHER PUBLICATIONS

Van Camp, B. et al., "Current detection trigger scheme for SCR based ESD protection of output drivers in CMOS technologies avoiding competitive triggering", Conference: Electrical Overstress/ Electrostatic Discharge Symposium, (2005), 10 pgs.

* cited by examiner

*Primary Examiner* — Nduka E Ojeh
(74) *Attorney, Agent, or Firm* — Scully, Scott, Murphy & Presser, P.C.; Samuel Waldbaum

(57) ABSTRACT

A semiconductor device includes a passive device includes a plurality of emitters, a plurality of collectors, a plurality of bases, a plurality of backside contacts connecting the plurality of bases to a backside of the semiconductor device. The plurality of bases are connected to each other via the plurality of backside contacts and a metal line on a backside of the semiconductor device.

18 Claims, 31 Drawing Sheets

BACKSIDE CONTACTS TO CONTROL THE VOLTAGE OF THE SUBSTRATE

BACKGROUND

Technical Field

The present disclosure generally relates to semiconductors, and more particularly, to semiconductors with backside contacts to control the voltage of the substrate structure, and methods of creation thereof.

Description of Related Art

The relentless miniaturization of transistors and their increasing density on chips epitomize the semiconductor industry's innovation, largely adhering to Moore's Law. This trend has led to transistors shrinking to nanometer scales, allowing millions and even billions to fit on a single chip, significantly enhancing computational power and energy efficiency. The evolution towards system-on-chip architectures integrates various functionalities, including processing and sensing, on one chip.

SUMMARY

According to an embodiment, a semiconductor device includes a passive device includes a plurality of emitters, a plurality of collectors, a plurality of bases, a plurality of backside contacts connecting the plurality of bases to a backside of the semiconductor device. The plurality of bases are connected to each other via the plurality of backside contacts and a metal line on a backside of the semiconductor device.

In one embodiment, the semiconductor device includes a first well and a second well. The first backside contact of the plurality of backside contacts is directly connected to the first well, and the second backside contact of the plurality of backside contacts is directly connected to the second well.

In one embodiment, the first backside contact and the second backside contact are directly connected to the metal line.

In one embodiment, the first well and the second well are N-type wells.

In one embodiment, the first well and the second well are P-type wells.

In one embodiment, the semiconductor device includes a logic device. The logic device includes a backside contact surrounded by a backside interlayer dielectric.

In one embodiment, the semiconductor device is an electro-static discharge (ESD) lateral NPN device, or an EDS lateral PNP device.

In one embodiment, the semiconductor device is an electro-static discharge ESD N-channel field-effect transistor (ESD NFET), an ESD P-Channel FET (ESD PFET), or a bipolar junction transistor (BJT).

In one embodiment, the metal line has a bias potential or a ground potential.

According to an embodiment, a method for fabrication of a semiconductor device includes forming a passive device comprising a plurality of emitters, a plurality of collectors, and a plurality of bases, forming a plurality of backside contacts, and connecting the plurality of bases to a backside of the semiconductor device via the plurality of backside contacts and a metal line on a backside of the semiconductor device.

In one embodiment, the method of claim includes forming a first well and a second well, directly connecting the first backside contact of the plurality of backside contacts to the first well, and directly connecting the second backside contact of the plurality of backside contacts to the second well.

In one embodiment, the first well and the second well are P-type wells.

In one embodiment, the first well and the second well are N-type wells.

In one embodiment, the method includes directly connecting the first backside contact to the metal line and directly connecting the second backside contact to the metal line.

In one embodiment, the method includes forming a logic device. The logic device includes a backside contact surrounded by a backside interlayer dielectric.

In one embodiment, the semiconductor device is an electro-static discharge (ESD) lateral NPN device, an EDS lateral PNP device, an ESD N-channel field-effect transistor (NFET), an ESD P-Channel FET (PFET), or a bipolar junction transistor (BJT).

In one embodiment, the method includes establishing a bias potential or a ground potential for the metal line.

According to an embodiment, a semiconductor device includes a passive device including a plurality of backside contacts, a silicon layer surrounding the plurality of backside contacts, and a metal layer connected to the plurality of the backside contacts on a backside of the semiconductor device. The metal layer is configured to act as a voltage reference.

In one embodiment, the semiconductor device includes a logic device. The logic device includes a backside contact surrounded by a backside interlayer dielectric.

In one embodiment, the silicon layer includes a P-type well or an N-type well.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

Figure 1A:
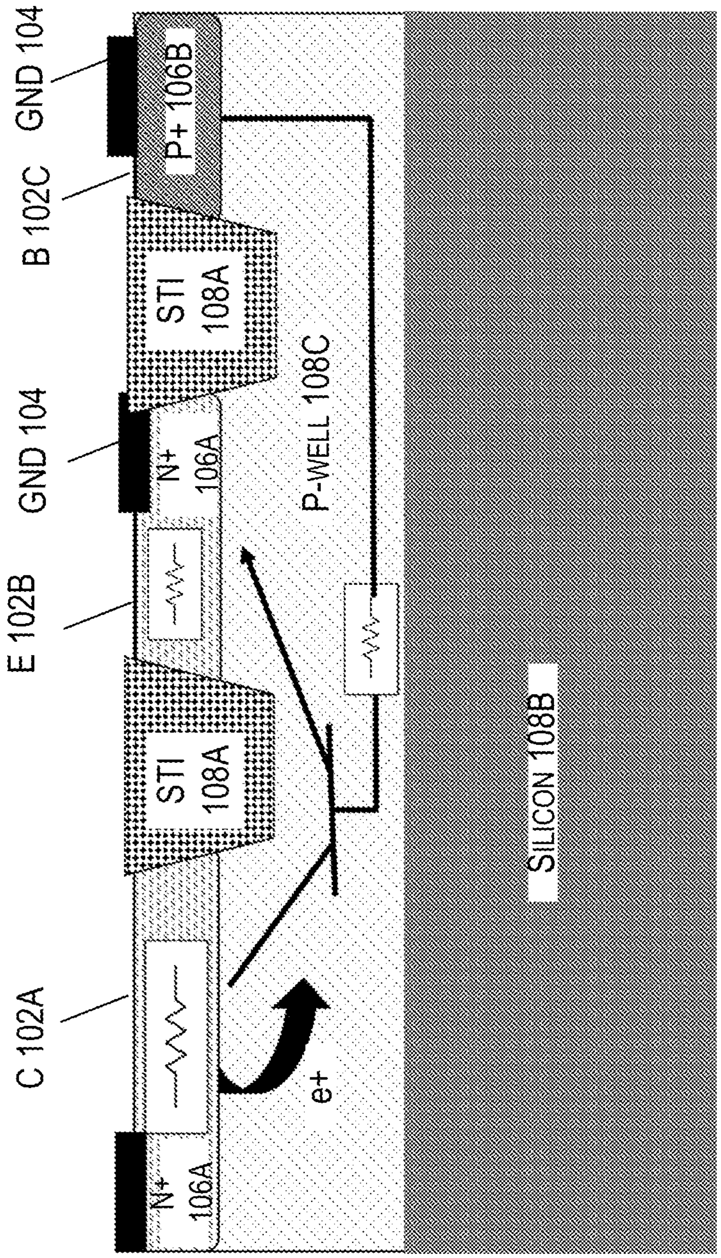
FIGS. 1A-1D illustrate conventional semiconductor devices.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the orientation of the Figures being described. Since components of embodiments of the disclosure can be positioned in a number of different orientations, the directional terminology is used for purposes of illustration and is in no way limiting. Thus, it will be understood that the spatially relative terminology is intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as below. The device may be otherwise oriented (rotated 90 degrees or viewed or referenced at other orientations) and the spatially relative descriptors used herein should be interpreted accordingly.

As used herein, the terms "lateral" and "horizontal" describe an orientation parallel to a first surface of a chip.

As used herein, the term "vertical" describes an orientation that is arranged perpendicular to the first surface of a chip, chip carrier, or semiconductor body.

As used herein, the terms "coupled" and/or "electrically coupled" are not meant to mean that the elements must be directly coupled together-intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

As used herein, certain terms are used indicating what may be considered an idealized behavior, such as, for example, "lossless," "superconductor," or "superconducting," which are intended to cover functionality that may not be exactly ideal but is within acceptable margins for a given application. For example, a certain level of loss or tolerance may be acceptable such that the resulting materials and structures may still be referred to by these "idealized" terms.

The concepts herein relate to electrostatic discharge (ESD) devices. ESD devices are integral in safeguarding electronic circuits from abrupt electrical discharges that might cause damage. These devices typically feature numerous fingers or blocks of diffusions, which are segments of semiconductor material modified by diffusion processes to achieve specific electrical characteristics. To create an ESD device that spans over 100 micrometers in width, designers often connect hundreds or thousands of these blocks in parallel.

One challenge in designing ESD devices is ensuring that all of the blocks to trigger simultaneously during an electrostatic event. If only some of the blocks experience electrostatic events, then for any two neighboring blocks with one triggered block and one non-triggered block, there is a voltage difference, which has an adverse effect to the semiconductor device as a whole. Thus, achieving synchronous triggering can be effective to protect the semiconductor device and to maintain uniform voltages across the p-well or substrate during the device's avalanche triggering. Avalanche triggering, a protective response, involves a rapid increase in current flow through the semiconductor device, leading to a multiplication of charge carriers that neutralize the discharge. The non-uniformity of p-well or substrate voltages can lead to staggered triggering across the device's blocks, resulting in uneven discharge current distribution. This non-uniformity risks incomplete protection or, in severe cases, localized damage due to excessive current concentration in certain blocks.

As an example, in an ESD device that incorporates three fingers/blocks, a single finger's activation can cause a collapse in the input voltage, effectively preventing the adjacent fingers from triggering. As a result, the discharge current, instead of being equally distributed among all three fingers, is channeled through just the one that has triggered. This leads to an overload in that finger, as it is forced to handle more current than it is designed for, potentially resulting in its failure. The failure of a finger not only undermines the protective capability of the ESD device but can also damage the electronic circuit it is supposed to safeguard.

In view of the above considerations, disclosed is a semiconductor device with backside contacts to control the voltage of the substrate and achieve simultaneous triggering of all fingers. The disclosed semiconductor device achieves the simultaneous triggering by maintaining a substantially identical substrate or base potential across each finger and ensuring that they are all equally likely to trigger in response to an ESD event. Moreover, the disclosed semiconductor device offers uniform substrate or base potential across the fingers to ensure that when an ESD event occurs, all fingers respond at the same moment, allowing the discharge current to be evenly distributed, which mitigates the risk of overloading any single finger.

Accordingly, the teachings herein provide methods and systems of semiconductor device formation with backside contacts to control the voltage of the substrate. The techniques described herein may be implemented in a number of ways. Example implementations are provided below with reference to the following figures.

Example Semiconductor Device with Backside Contacts to Control the Voltage of the Substrate Structure FIGS. 1A-1D illustrate conventional semiconductor devices. Referring to FIG. 1A now, an ESD lateral negative-positive-negative (ESDLNPN) is shown. The ESDLNPN can include a collector, C 102A, an emitter, E 102B, and a base, B 102C. Typically, in a conventional semiconductor device, the E 102B/B 102C shorting occurs with metal to ground, GND 104, and the C 102A is zapped. The collector/base junction, i.e., C 102A/B 102C junction, encounters a reverse biased avalanche which produces holes in the substrate/P-well, until the P-well 106B rises to a triggering voltage, such as 0.7V, at which point the B 102C/E 102B junction is triggered. The onset on FIG. 1A shows a depletion region between the N-type doped region 106A and the P-type doped region 106B.

Figure 1B:
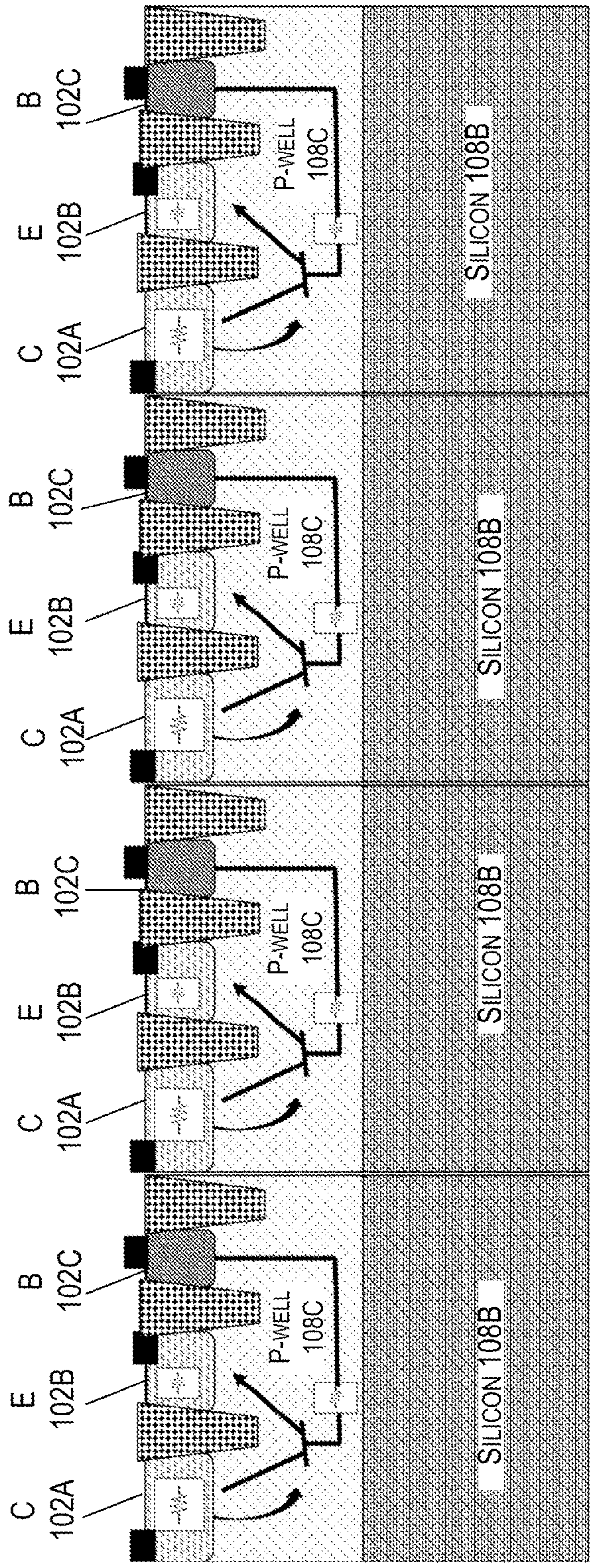

FIG. 1B illustrates a conventional semiconductor device with multiple fingers. FIG. 1B depicts multiple ESDLNPN each of which can be the same device as shown in FIG. 1A. In a conventional semiconductor device with multiple fingers, when one finger triggers, the voltage of the collector, C 102A, collapses and none of the other fingers will trigger. As a result, the current that the ESDLNPN can handle significantly drops.

Figure 1C:
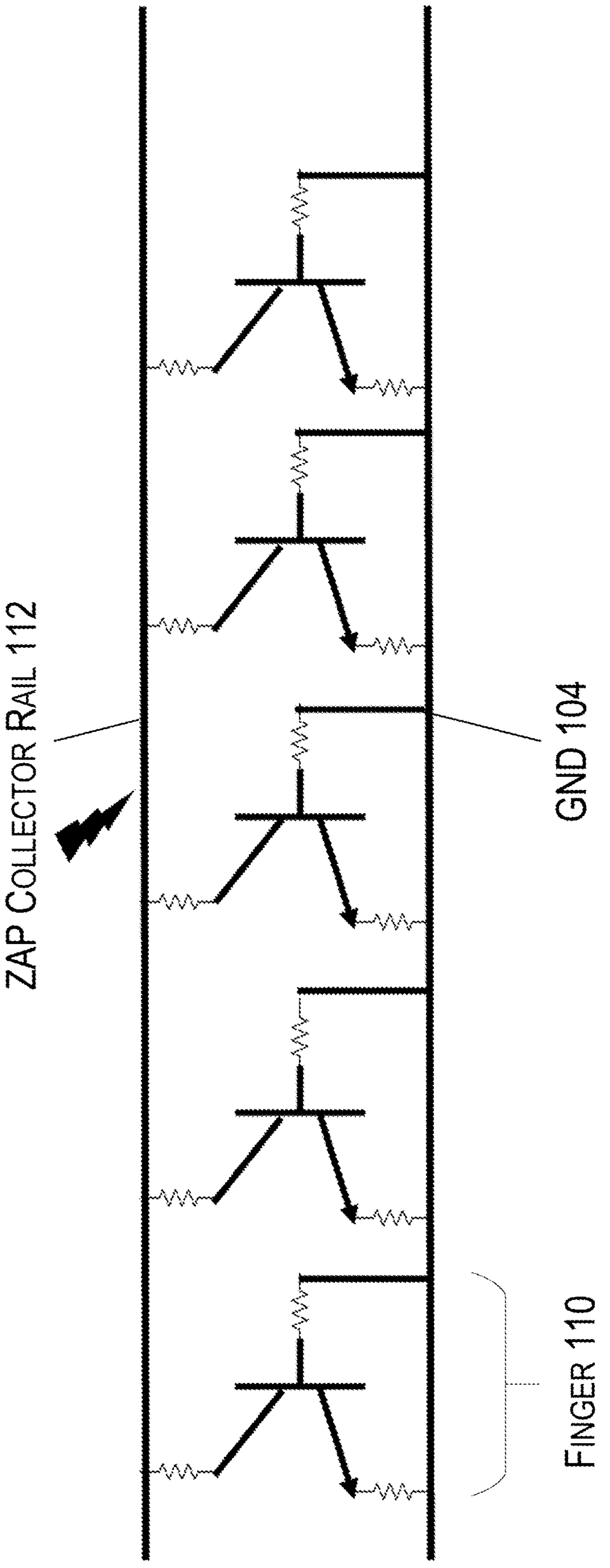

FIG. 1C illustrates an equivalent circuit within each finger of a conventional semiconductor device. FIG. 1C depicts multiple fingers 110, connected to the ZAP collector rail 112 on one side and ground, GND 104, on the other side. In some embodiments, when one overall substrate, substrate 108B, is utilized as the common substrate for all of the multiple fingers 110, the substrate resistance of each of the multiple fingers 110 can be different. In some embodiments, in response to one of the multiple fingers 110 being triggered, the input voltage is collapsed and as a result, other fingers do not trigger and the current crowds through only the triggered finger and fails.

Figure 1D:
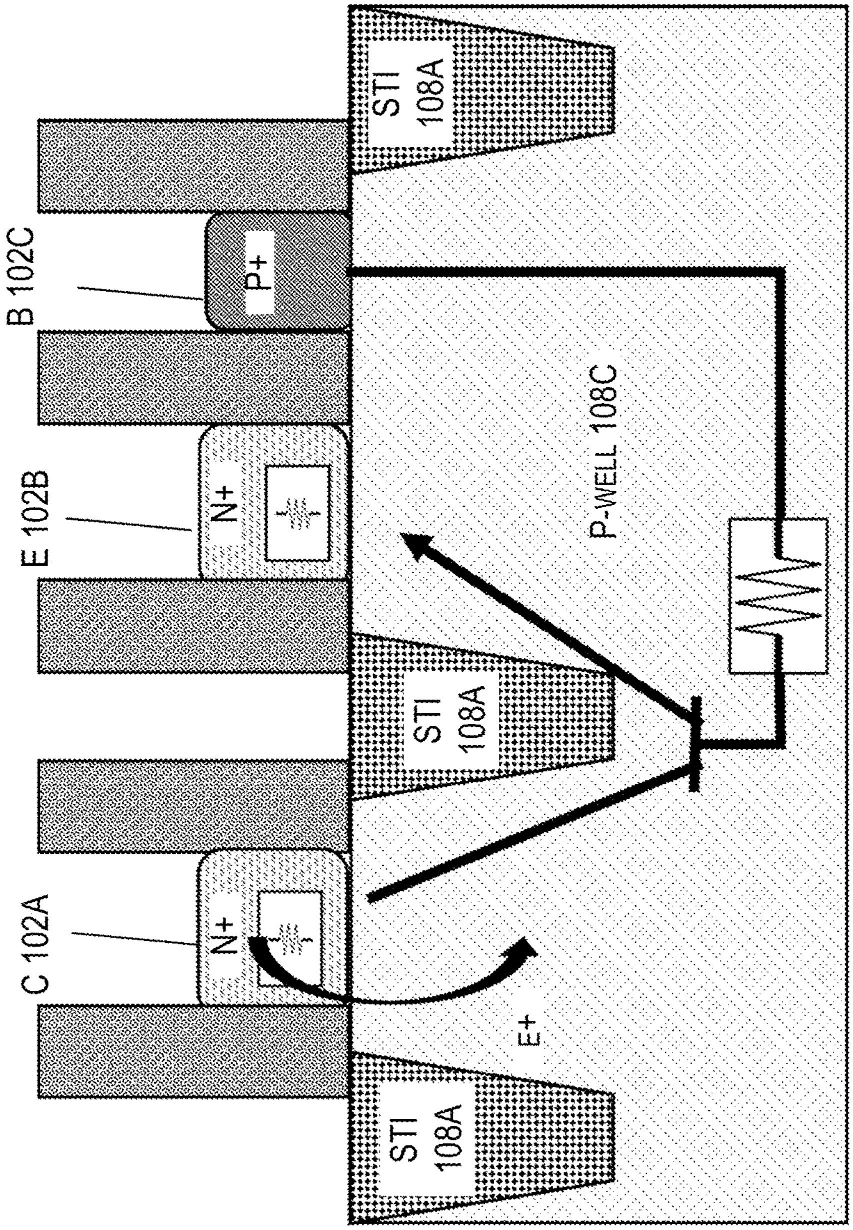

FIG. 1D illustrates a nanosheet conventional semiconductor device. The ESDLNPN can be a nanosheet ESDLNPN. Although the nanosheet ESDLNPN shown in FIG. 1D is a single finger semiconductor device, the nanosheet ESDLNPN can be a multiple finger semiconductor device.

Figure 2A:
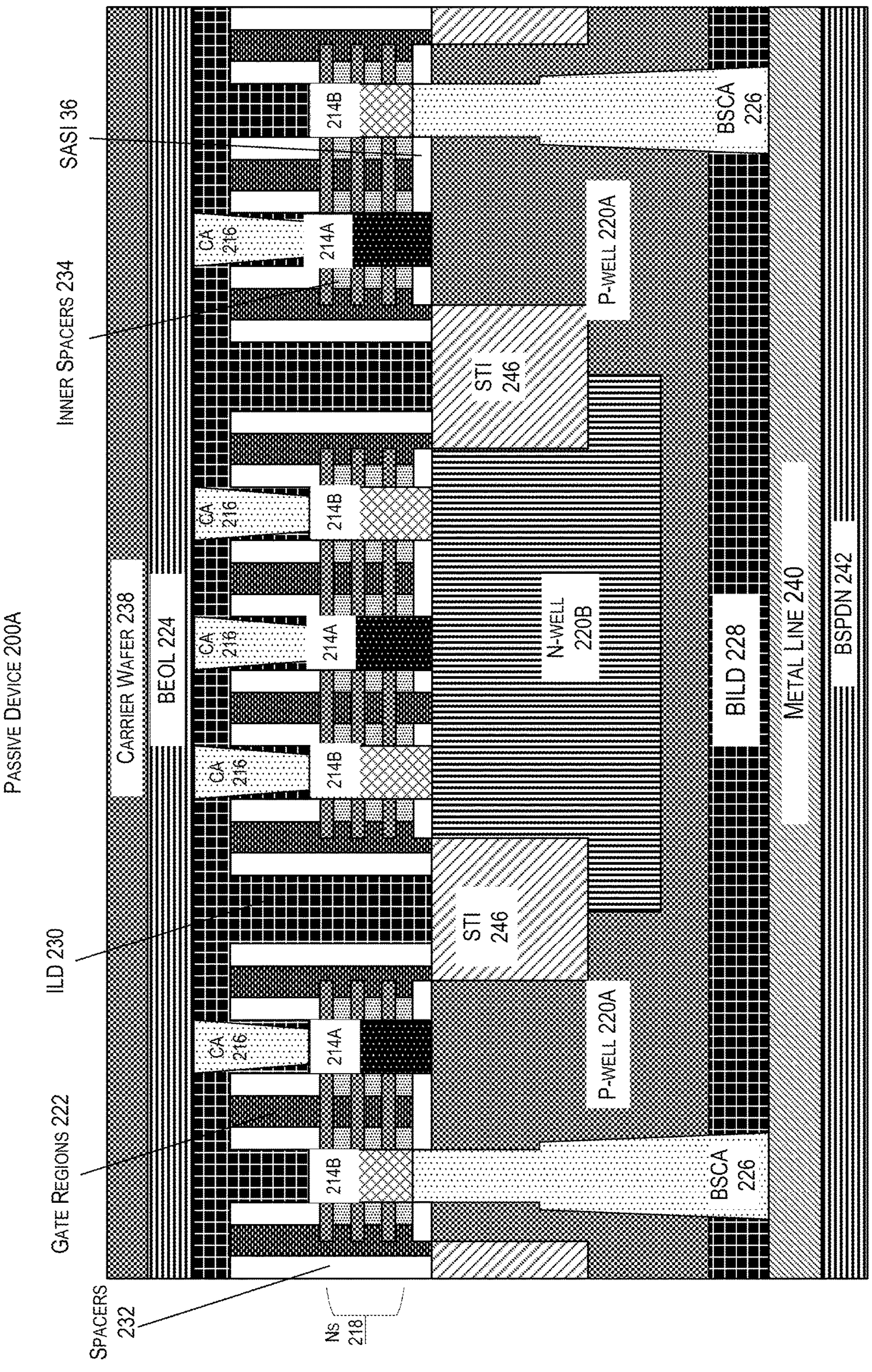
FIG. 2A illustrates a passive device of a semiconductor device, in accordance with some embodiments.
Figure 2B:
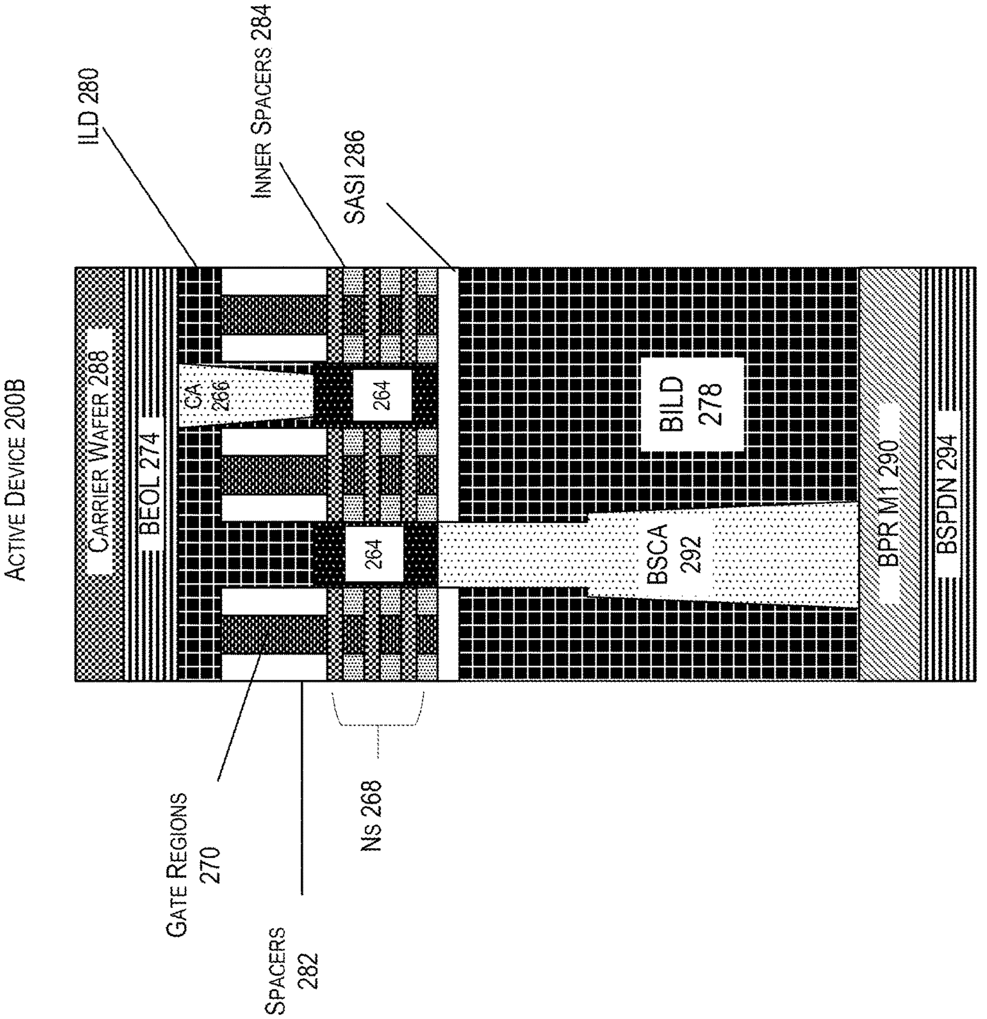
FIG. 2B illustrates an active device of a semiconductor device, in accordance with some embodiments.
Figure 2C:
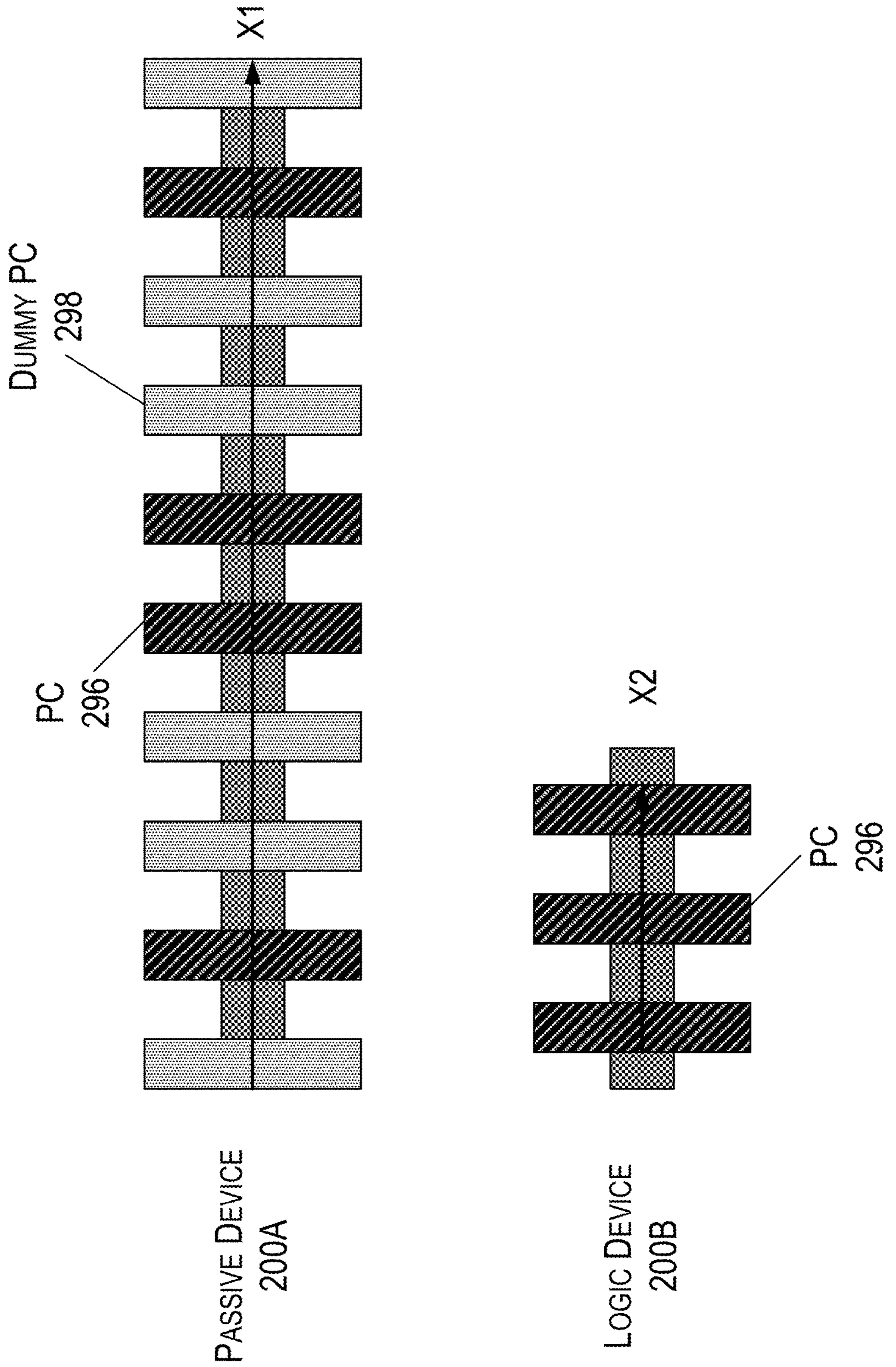
FIG. 2C illustrates a top view of a semiconductor device, in accordance with some embodiments.
Figure 2D:
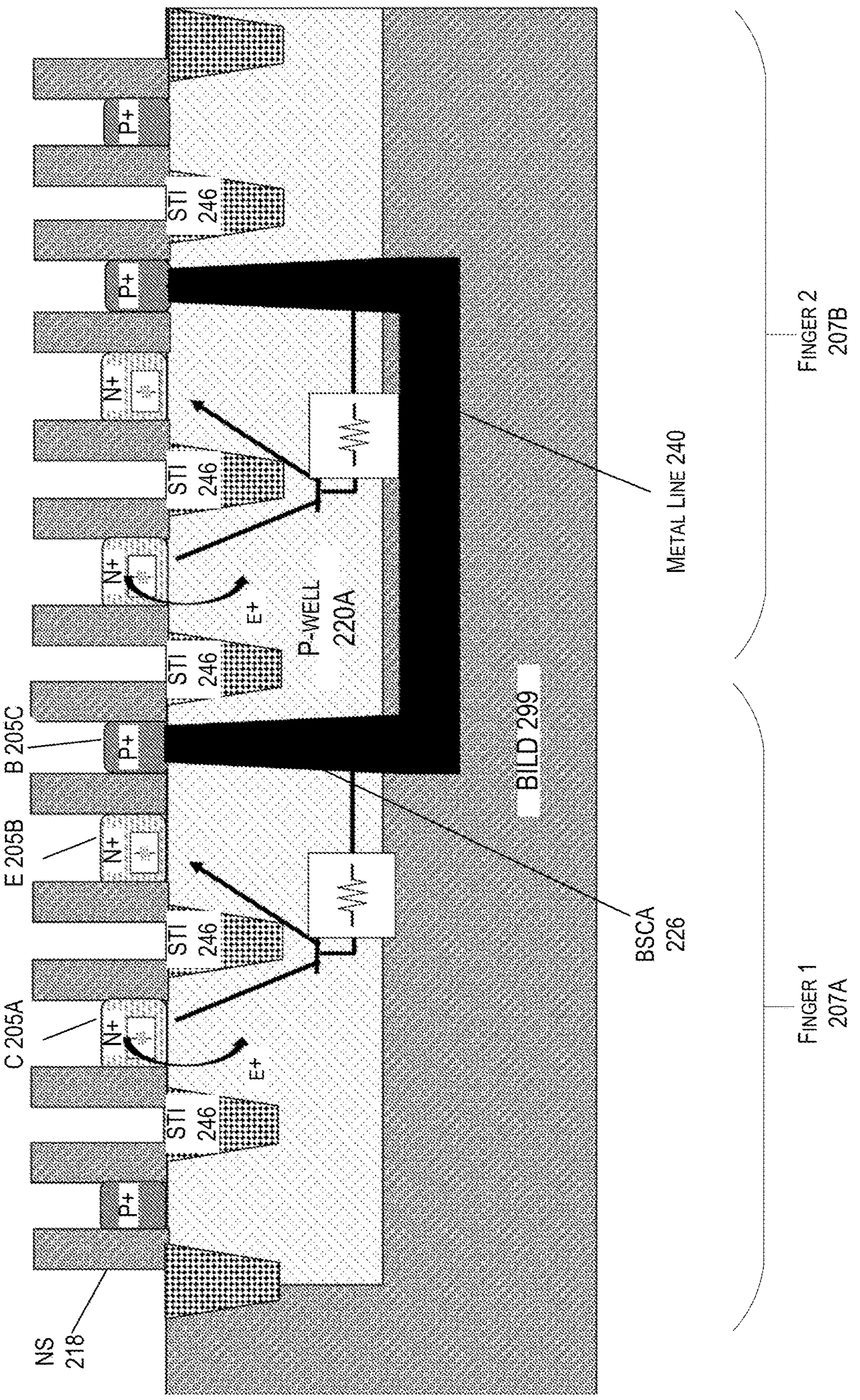
FIG. 2D illustrates a passive device of a semiconductor device with multiple fingers, in accordance with some embodiments.

Reference now is made to FIGS. 2A-2D, which are simplified cross-sections view of a semiconductor device, consistent with an illustrative embodiment. In various embodiments, the semiconductor device includes a passive device 200A, as shown in FIG. 2A, and an active device 200B, as shown in FIG. 2B. While for the sake of simplicity, the passive device 200A and the active device 200B are depicted separately, it should be noted that the passive device 200A and the active device 200B can be integrated on a same semiconductor device adjacent to each other. FIG. 2C illustrates a top view of the passive device 200A and the active device 200B depicting the gate regions, PC 296, and dummy gate regions, dummy PC 298. FIG. 2D illustrates a passive device 200A including multiple fingers, in accordance with some embodiments.

The passive device 200A can include a plurality of N-type doped sections 214A, a plurality of P-typed doped sections 214B, a plurality of contacts, CA 216, a plurality of sets of nanosheets, NS 218, a P-well 220A, an N-well 220B, gate regions 222, a back end of line, BEOL 224, backside contacts, BSCA 226, a bottom dielectric layer, BILD 228, an interlayer dielectric, ILD 230, spacers 232, inner spacers 234, a self-assembly substrate isolation, SASI 236, a carrier wafer 238, a metal line 240, a backside power delivery network, BSPDN 242, and shallow trench isolation, STI 246.

Each pair of plurality of N-type doped sections 214A and the plurality of P-typed doped sections 214B form the p-n junction of the passive device 200A. The p-n junction in the passive device 200A controls the flow of electrical current within the semiconductor device. The p-n junction can be created by doping two adjacent regions of the passive device 200A, one with a type P dopant, which introduces an excess of positive charge carriers (holes), and the other with a type N dopant, which introduces an excess of negative charge carriers (electrons). At the interface between the P and N regions, a depletion region forms due to the diffusion of electrons from the N region into the P region and the diffusion of holes in the opposite direction. Such a diffusion process continues until the electric field created by the accumulation of charge at the junction balances the diffusion forces, resulting in a zone depleted of free charge carriers. In its natural state, the p-n junction allows current to flow more easily in one direction than in the opposite. When forward biased, i.e., positive voltage applied to the P side relative to the N side, the depletion region narrows, lowering the barrier for charge carriers to move across the junction, and allowing current to flow through the device. Conversely, when reverse-biased, i.e., negative voltage applied to the P side, the depletion region widens, increasing the barrier for charge movement, and significantly reducing the flow of current.

The CA 216, located over the plurality of N-type doped sections 214A and the plurality of P-typed doped sections 114B, can establish connections between the plurality of N-type doped sections 214A and the plurality of P-typed doped sections 214B and the BEOL 224. The CA 216 can ensure efficient electrical routing and connectivity within the passive device 200A. The fabrication of the CA 216 can involve lithography and etching processes to define the contact area. The CA 216 can be made using conductive materials such as copper (Cu) or tungsten (W).

The NS 218 can be alternating, vertically oriented sheets, which can drive current in a small footprint area. In some embodiments, NS 218 can include silicon nanowires. In other words, NS 218 can include three-dimensional structures in the gate, which are extended from one of the plurality of N-type doped sections 214A toward one of the plurality of P-typed doped sections 214B.

The P-well 220A and the N-well 220B are regions created within the silicon substrate. The P-well 220A is a region of p-type doping formed by the substrate and creates a localized area with a higher concentration of positively charged “holes” compared to the surrounding n-type material. On the other hand, the N-well 220B is a region of n-type doping formed within the substrate and creates a localized area with a higher concentration of negatively charged electrons compared to the surrounding p-type material.

In various embodiments, the gate regions 222 serve as control elements that regulate the flow of current through the passive device 200A. The gate regions 222 can be composed of a conductive material. The gate regions 222 can control the flow of electric current between the plurality of N-type doped sections 214A and the plurality of P-typed doped sections 214B.

In some embodiments, by applying a voltage to the gate, the channel region’s conductivity is modulated, allowing the passive device 200A to either allow or block the flow of current, which in turn enables the semiconductor device to act as electronic switches or amplifiers. The gate voltage can determine whether the semiconductor device is in an “on” or “off” state. When the gate voltage is below a certain threshold, the passive device 200A is in the “off” state, and the current flow between the source and drain is effectively blocked. On the other hand, when the gate voltage exceeds the threshold, the passive device 200A enters the “on” state, allowing current to flow through the channel region. In addition to acting as a switch, modulating the gate voltage can enable the gate regions 222 to control the current flowing through the channel region, resulting in amplified output signals.

In an embodiment, the gate regions 222 can enable the implementation of Boolean logic operations, such as AND, OR, and NOT, by controlling the flow of current based on the input voltages. Multiple semiconductor devices can be interconnected to form complex logic circuits, enabling the execution of various computational tasks in digital systems. In some embodiments, the gate regions 222, along with other semiconductor device components, can facilitate the miniaturization and integration of electronic circuits. The ability to control the channel region’s conductivity through the gate voltage allows for compact and highly efficient circuit designs.

The BSCA 226 is a region on the backside of the passive device 200A where electrical connections are made. By establishing the electrical contacts, the BSCA 226 ensures the proper functioning of the passive device 200A and facilitates electrical signal transmission. The BSCA 226 can serve as a thermal interface between the passive device 100A and a heat sink or other cooling mechanisms. By establishing direct contact with the substrate, the BSCA 226 can conduct the heat away from the passive device 200A, and contribute to improved thermal dissipation. In some embodiments, the BSCA 226 can help mitigate parasitic effects, such as substrate coupling or substrate noise, from the passive device 200A. In further embodiments, the BSCA 226 can allow for increased integration density in the passive device 200A. In an embodiment, the BSCA 226 can serve as a means of providing electrostatic discharge (ESD) protection to the passive device 200A. ESD events can cause significant damage to sensitive electronic components and thus should be avoided. In some embodiments, the BSCA 226 is surrounded by the P-well 220A. Alternatively, in some embodiments, the BSCA 226 is surrounded by the N-well 220B.

In several embodiments, the BILD 228 can provide structural support to the passive device 200A by maintaining the mechanical integrity and stability of the passive device 200A. The BILD 228 can further help prevent the warping, bending, or cracking of the substrate, particularly during the manufacturing process or subsequent handling. The BILD 228 can ensure that the passive device 200A remains mechanically robust and maintains its dimensional stability.

In an embodiment, the BILD 228 can also serve as a planarization layer in the passive device 200A fabrication process. As various layers are deposited and patterned on the front side of the passive device 200A, irregularities or topographic variations may arise. The BILD 228 can be used to smoothen the surface, creating a more planar substrate for subsequent processing steps, such as metal interconnect deposition or bonding. In some embodiments, a low dielectric constant BILD material can be utilized to reduce signal delays, crosstalk, and power consumption in high-speed and high-frequency circuits. By optimizing the dielectric constant, the BILD 228 can contribute to improved overall passive device performance. In several embodiments, BILD 228 can facilitate wafer-level testing of the passive device 200A. By providing electrical isolation between the active regions and the backside contact, individual passive device or elements on the passive device 200A can be electrically accessed and tested without interference from neighboring devices or components. This enables efficient and accurate wafer-level testing, ensuring quality control during semiconductor manufacturing.

The ILD 230 can be a layer of insulating material to electrically isolate and provide mechanical support between different layers of conducting and active components. The ILD 230 can enable efficient signal transmission, reduce crosstalk, and ensure the proper functioning of the passive device 200A. In an embodiment, the ILD 230 can electrically isolate adjacent conducting layers or active components in the passive device 200A. By providing insulation between different layers, the ILD 230 can prevent electrical shorts, reduce (e.g., minimize) leakage current, and ensure that signals are directed only along the desired pathways. In some embodiments, the ILD 230 can help reduce parasitic capacitance between adjacent metal interconnects or active devices and provide mechanical support to the passive device’s structure.

The spacers 232 are an insulating material layer that surrounds and isolates the gate electrode of the semiconductor device. The spacers 232 electrically isolate the gate from a source/drain region to prevent unwanted electrical leakage. In some embodiments, the spacers 232 can help define the length of the gate beneath the gate electrode. In various embodiments, the spacers 232 can be made of silicon dioxide (SiO2), silicon nitride (Si3N4), or a high-k dielectric.

The inner spacers 234 are insulating material layers that isolate the nanosheets of the semiconductor device. The inner spacers 234 electrically isolate the individual nanosheets from each other to prevent unwanted electrical leakage. In some embodiments, the inner spacers 234 are made of silicon dioxide (SiO2), silicon nitride (Si3N4), or a high-k dielectric.

SASI 236 can be utilized to isolate the passive device's structure from the substrate electrically. The SASI 236 can provide isolation and reduce parasitic capacitance and leakage currents between the passive device 200A and the substrate layer. SASI 236 is a dielectric material that can help improve the passive device 200A performance and reliability by minimizing undesirable effects such as substrate leakage and latch-up. The metal line 240 can include conductive interconnects to provide electrical connection between the passive device 200A and the BSPDN 242.

The STI 246 helps prevent electrical crosstalk and interference between adjacent components, allowing for the proper functioning of integrated circuits. The BILD 228 can be an insulating material or layer used to isolate and provide electrical insulation between the passive device's active regions and the BSCA 226, and to prevent unwanted electrical contact between the active regions and the backside contact, ensuring the proper functioning and integrity of the passive device 200A. In various embodiments, the BILD 228 can act as a protective layer, shielding the active regions of the passive device from external contaminants, moisture, and mechanical stress. The BILD 228 can further help prevent physical damage, such as scratches or particle contamination, which could adversely affect passive device performance. Additionally, the BILD 228 can act as a barrier against moisture ingress, which can cause corrosion and degradation of the passive device's components.

Reference is now made to FIG. 2B, where an active device of a semiconductor device is illustrated, according to some embodiments. In some embodiments, the active device 200B, which can be a transistor, can include a source/drain region 264, a contact, CA 266, NS 268, gate regions 270, BEOL 274, BILD 278, ILD 280, spacers 282, inner spacers 284, a self-assembly substrate isolation, SASI 286, a carrier wafer 288, a backside power line metal, BPR M1 290, a BSCA 292, and BSPDN 294.

Generally, the source/drain regions, such as the source/drain region 264, are salient components that play relevant roles in the semiconductor device's operation. In various embodiments, the source/drain region 264 is a region within the semiconductor material, e.g., the semiconductor device, where the current flows in and out of the semiconductor device. The source region is the region through which the majority of charge carriers (e.g., electrons or holes) enter the channel of the semiconductor device and is responsible for providing the current that flows through the semiconductor device. The source region is typically doped to have an excess of charge carriers, creating a region with high carrier concentration. This abundance of carriers allows for the efficient injection of electrons or holes into the channel when a voltage is applied.

The drain region, on the other hand, is the region where the majority of charge carriers exit the channel. The drain region receives the current from the channel and carries the charge away from the transistor. Similar to the source, the drain region is also doped to have a high carrier concentration. The doping profile in the drain region ensures that carriers can easily flow out of the channel and into the drain region.

The CA 266, located over the source/drain region 124, can establish connections between the source/drain region 264 and the BEOL 274. The CA 266 can ensure efficient electrical routing and connectivity within the active device 200B. The fabrication of the CA 266 can involve lithography and etching processes to define the contact area. The CA 266 can be made using conductive materials such as copper (Cu) or tungsten (W).

The NS 268 can be alternating, vertically oriented sheets, which can drive current in a small footprint area. In some embodiments, NS 268 includes silicon nanowires. In other words, NS 268 includes three-dimensional structures in the gate, which are extended from a source region towards a drain region.

In various embodiments, the gate regions 270 serve as control elements that regulate the flow of current through the active device 200B. The gate regions 270 can be composed of a conductive material. The gate regions 270 can control the flow of electric current between the source and drain regions. In addition to acting as a switch, modulating the gate voltage can enable the gate regions 270 to control the current flowing through the channel region, resulting in amplified output signals.

In an embodiment, the gate regions 270 can enable the implementation of Boolean logic operations, such as AND, OR, and NOT, by controlling the flow of current based on the input voltages. In some embodiments, the gate regions 270, along with other active device components, can facilitate the miniaturization and integration of electronic circuits. The ability to control the channel region's conductivity through the gate voltage allows for compact and highly efficient circuit designs.

In several embodiments, the BILD 278 can provide structural support to the semiconductor device by maintaining the mechanical integrity and stability of the active device 200B. The BILD 278 can further help prevent the warping, bending, or cracking of the substrate, particularly during the manufacturing process or subsequent handling. The BILD 278 can ensure that the active device 200B remains mechanically robust and maintains its dimensional stability. In some embodiments, the BILD 278 surrounds the BSCA 292.

In an embodiment, the BILD 278 can also serve as a planarization layer in the active device 200B fabrication process. As various layers are deposited and patterned on the front side of the active device 200B, irregularities or topographic variations may arise. The BILD 278 can be used to smoothen the surface, creating a more planar substrate for subsequent processing steps, such as metal interconnect deposition or bonding. In some embodiments, a low dielectric constant BILD material can be utilized to reduce signal delays, crosstalk, and power consumption in high-speed and high-frequency circuits. By optimizing the dielectric constant, the BILD 278 can contribute to improved overall semiconductor device performance. In several embodiments, BILD 278 can facilitate wafer-level testing of the semiconductor device. By providing electrical isolation between the active regions and the backside contact, individual active device or elements on the active device 200B can be electrically accessed and tested without interference from neighboring devices or components. This enables efficient and accurate wafer-level testing, ensuring quality control during semiconductor manufacturing.

The ILD 280 can be a layer of insulating material to electrically isolate and provide mechanical support between different layers of conducting and active components. The ILD 280 can enable efficient signal transmission, reduce crosstalk, and ensure the proper functioning of the active device 200B. In an embodiment, the ILD 280 can electrically isolate adjacent conducting layers or active components in the active device 200B. By providing insulation between different layers, the ILD 280 can prevent electrical shorts, reduce (e.g., minimize) leakage current, and ensure that signals are directed only along the desired pathways. In some embodiments, the ILD 280 can help reduce parasitic capacitance between adjacent metal interconnects or active devices and provide mechanical support to the active device's structure.

The spacers 282 is an insulating material layer that surrounds and isolates the gate electrode of the active device 200B. The spacers 282 electrically isolates the gate regions 270 from a source/drain region 264 to prevent unwanted electrical leakage. In some embodiments, the spacers 282 can help define the length of the gate beneath the gate electrode. In some embodiments, the spacers 282 is made of silicon dioxide (SiO2), silicon nitride (Si3N4), or a high-k dielectric.

The inner spacers 284 are insulating material layers that isolate the nanosheets of the active device 200B. The inner spacers 284 can electrically isolate the individual nanosheets from each other to prevent unwanted electrical leakage. In some embodiments, the inner spacers 284 are made of silicon dioxide (SiO2), silicon nitride (Si3N4), or a high-k dielectric. The BPR M1 290 can include the interconnections to electrically connect the active device 200B to the BSPDN 294.

SASI 286 can electrically isolate individual components in the active device 200B, and provide electrical isolation between the components. That is, SASI 286 can ensure that the operation of one component does not interfere with the operation of the others. By using a dielectric layer, which is an insulating layer that does not conduct electricity, SASI 286 effectively prevents electrical crosstalk between the transistors and allows each one to operate independently. Further, by electrically isolating each transistor from the other, SASI 286 can reduce the potential for crosstalk, which is the unwanted transfer of signals between circuit elements, thereby improving the overall performance of the active device 200B.

By isolating each transistor, SASI 286 helps to prevent the failure of one transistor from affecting the others, which can improve the overall reliability of the active device 200B. Additionally, SASI 286 allows for more flexibility in device design, as it allows each transistor in the stack to be accessed and controlled independently, which can be beneficial in a variety of applications where specific transistors may need to be activated or deactivated based on certain conditions. In some embodiments, SASI 286 can help decrease the parasitic capacitance associated with the transistor, which can lead to faster switching times and improved performance.

The BSCA 292 is a region on the backside of the active device 200B where electrical connections are made. By establishing the electrical contacts, the BSCA 292 can ensure the proper functioning of the active device 200B and facilitates electrical signal transmission. The BSCA 292 can serve as a thermal interface between the active device 200B and a heat sink or other cooling mechanisms. By establishing direct contact with the substrate, the BSCA 292 can conduct the heat away from the active device 200B, and contribute to improved thermal dissipation. In some embodiments, the BSCA 292 can help mitigate parasitic effects, such as substrate coupling or substrate noise, from the active device 200B. In further embodiments, the BSCA 292 can allow for increased integration density in the active device 200B.

In some embodiments, the semiconductor device can include an ESD lateral NPN which includes a heavily doped n-type region (collector), a lightly doped p-type region (base), and a heavily doped n-type region (emitter). These regions are laterally arranged on the surface of the semiconductor substrate. When an ESD event occurs, a large transient voltage is applied across the device. The resulting high electric field causes the device to enter into avalanche breakdown, allowing it to conduct a large current to ground and dissipate the excess charge, protecting the integrated circuit from damage.

In an ESD lateral PNP device, the structure is similar but with opposite doping: a heavily doped p-type region (collector), a lightly doped n-type region (base), and a heavily doped p-type region (emitter). Similar to the lateral NPN device, when subjected to an ESD event, the lateral PNP device enters into avalanche breakdown, providing a low-impedance path for the discharge current to flow safely to ground, protecting the integrated circuit.

In some embodiments, the semiconductor device includes an ESD N-channel Field-Effect Transistor (ESD NFET), ESD P-channel Field-Effect Transistor (ESD PFET), or a Bipolar Junction Transistor (BJT). ESD NFET can include heavily doped n-type source and drain regions, separated by a lightly doped n-type channel. During an ESD event, a high voltage at the gate forms an inversion layer in the channel, allowing current to flow from source to drain. ESD NFET provides low impedance for negative voltage transients, diverting current away from sensitive circuitry. ESD PFET, provides ESD protection against positive voltage transients, and includes heavily doped p-type source and drain regions, with a lightly doped p-type channel. When an ESD event occurs, a negative voltage applied to the gate forms an inversion layer, enabling current flow from drain to source. PFETs offer low impedance for positive voltage spikes, shunting current away from sensitive components. A BJT features three layers-emitter, base, and collector forming two P-N junctions. During an ESD event, BJTs enter into avalanche breakdown when voltage surpasses a threshold, allowing a large current flow either from collector to emitter (NPN) or emitter to collector (PNP).

Reference is now made to FIG. 2D which illustrates a passive device 200A, in accordance with some embodiments. In some embodiments, the passive device is an ESD lateral including multiple fingers, e.g., finger 1 207A and finger 2 207B. Each finger can include a collector, C 205A, an emitter, E 205B, a base, B 205C, STI 246, a BSCA 226, and bottom ILD, BILD 229. The local well contact of each finger, i.e., each finger's base, can be connected to the local well contact of the other finger via the BSCA 226 and the metal line 240.

Example Fabrication of Semiconductor Device with Backside Contacts to Control the Voltage of the Substrate With the foregoing description of an example semiconductor device, it may be helpful to discuss an example process of manufacturing the same. To that end, FIGS. 3-13 illustrate various acts in the manufacture of a semiconductor device, consistent with illustrative embodiments.

Figure 3A:
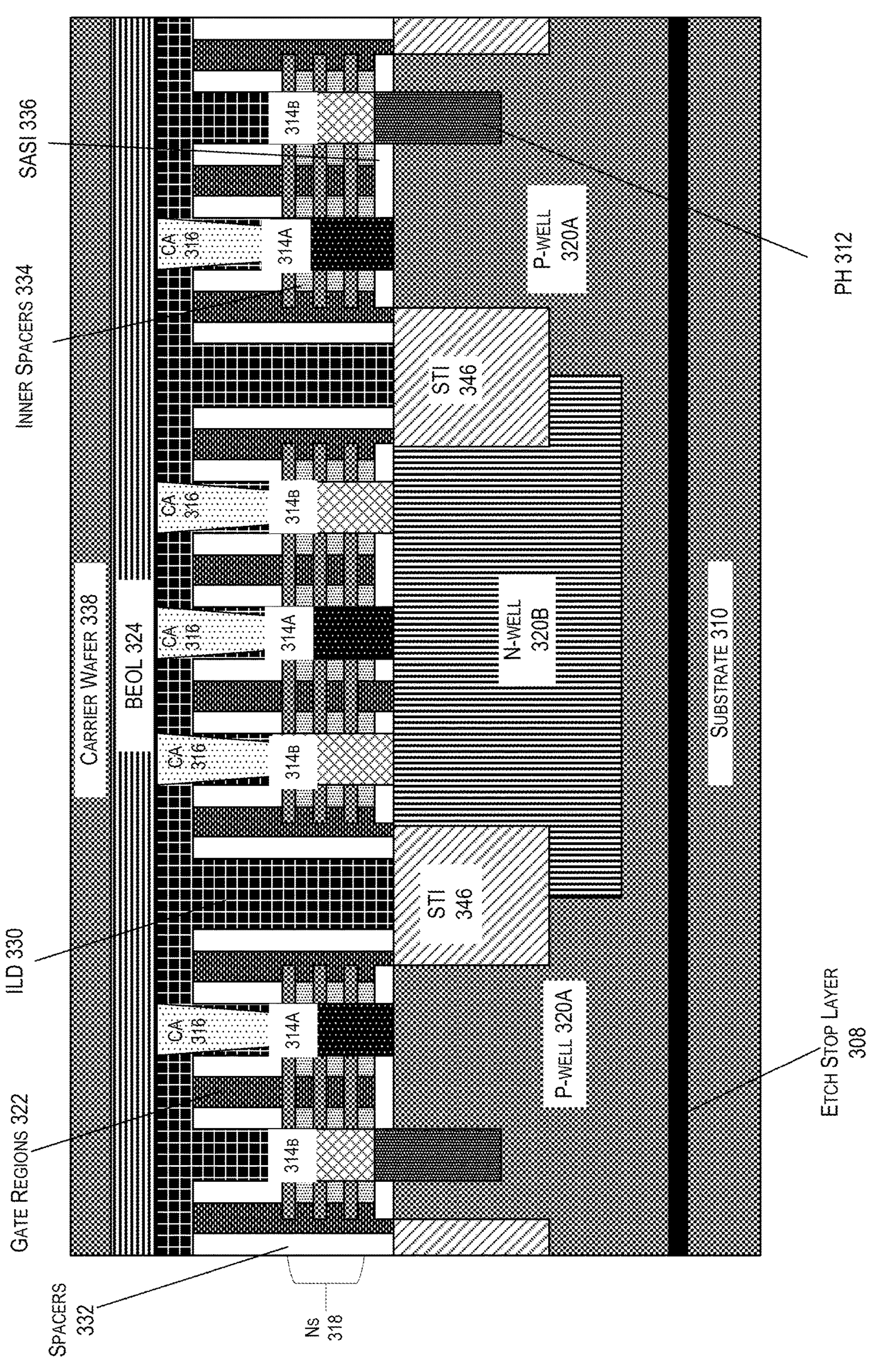
FIGS. 3A-3B illustrate a semiconductor device after the front end of line (FEOL), middle of line (MOL), and BEOL, consistent with an illustrative embodiment.
Figure 3B:
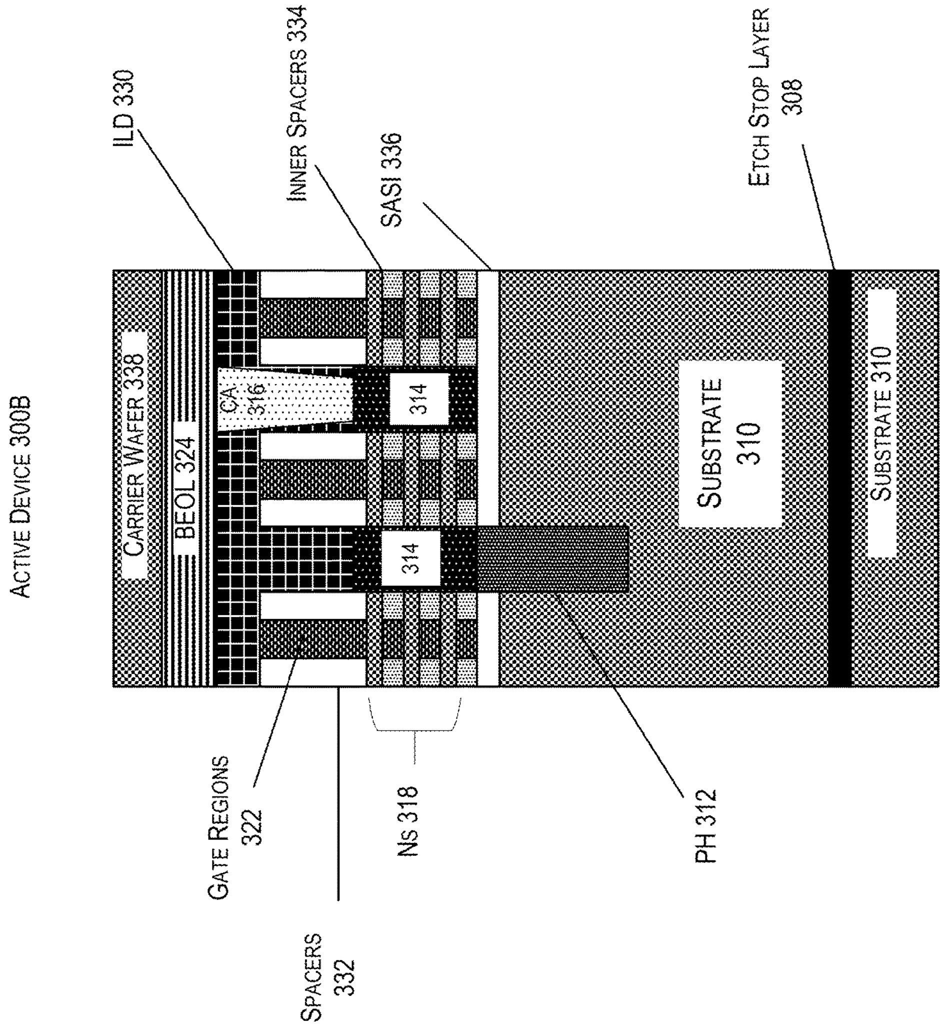

Reference now is made to FIGS. 3A-3B, which are simplified cross-section views of a semiconductor device, after the front end of line (FEOL), middle of line (MOL), and BEOL, consistent with an illustrative embodiment. As noted above, the semiconductor device includes a passive device 300A and an active device 300B. While for the sake of avoiding clutter, the passive device 300A and the active device 300B are depicted separately, it should be noted that the passive device 300A and the active device 300B can be integrated on a same semiconductor device adjacent each other.

The passive device 300A can include a plurality of N-type doped sections 314A, a plurality of P-typed doped sections 314B, a plurality of contacts, CA 316, a P-well 310A, an N-well 310B, backside contacts, BSCA 326, and a metal line 340. As shown in FIG. 3B, the active device 300B, which can be a transistor, can include a source/drain region 364, a contact, CA 366, a backside power line metal, BPR M1 390, and BSCA 392.

The semiconductor device can further include an etch stop layer 308, a substrate 348, a plurality of set of nanosheets, NS 318, gate regions 322, BEOL 324, ILD 330, spacers 332, inner spacers 334, SASI 336, a carrier wafer 338, BSPDN 342, and STI 346, In the illustrative example depicted in FIGS. 3A-3B, the semiconductor device is depicted as being on silicon as the substrate 348, while it will be understood that other types as the substrate 348 may be used as well, including, without limitation, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs), and quaternary (four elements, e.g., aluminum gallium indium phosphide (AlInGaP)) alloys.

In various embodiments, the substrate 348 can include any suitable material or combination of materials, such as doped or undoped silicon, glass, dielectrics, etc. For example, the substrate may include a silicon-on-insulator (SOI) structure, e.g., with a buried insulator layer, or a bulk material substrate, e.g., with appropriately doped regions, typically referred to as wells. In another embodiment, the substrate may be silicon with silicon oxide, nitride, or any other insulating film on top.

In various embodiments, the etch stop layer 308 is formed over the substrate 348. The etch stop layer 308 can be a thin layer of material incorporated into the structure of the semiconductor device to provide a selective barrier against etching processes, preventing further removal of underlying materials during fabrication. The etch stop layer 308 can enable precise control over the etching depth and help define the desired device dimensions. The etch stop layer 308 can further provide a stopping point for the etching process, ensuring that specific layers or regions are not etched beyond a certain point, leading to accurate patterning and control of critical features. The etch stop layer 308 can create a distinct separation between different layers or components within the device structure, and prevent the undesired etching of underlying layers or materials, enabling the creation of complex, multi-layered structures with well-defined interfaces and boundaries. In some embodiments, the etch stop layer 308 acts as a protective barrier for sensitive or delicate materials to shield such materials from aggressive etchants, preventing damage or degradation during subsequent fabrication steps.

In some embodiments, prior to forming the etch stop layer 308, the substrate 248 is prepared by cleaning and removing any impurities or oxide layers. The etch stop layer 308 is deposited onto the substrate 348 using techniques such as chemical vapor deposition (CVD), physical vapor deposition (PVD), or atomic layer deposition (ALD). In an embodiment, a photoresist can be applied, exposed to a patterned mask, developed, and used as a protective layer to define the etch stop regions. The etch stop layer 308 can then be selectively etched, stopping at a predetermined depth, while protecting the underlying layers. After the etching process, the remaining photoresist can be removed through stripping techniques. While in some embodiments, SiGe is used to form the etch stop layer 308, in some embodiments, silicon nitride (SiN), silicon oxide (SiO2), or silicon oxynitride (SiON) can be used as the etch stop layer 308.

In some embodiments, the NS 318 can be formed by alternating layers of Si layers and SiGe layers, in which sidewalls of the SiGe layers are indented and covered by the inner spacers 334. The SiGe layers can subsequently be removed and replaced with gate region materials.

The spacers 332 can be thin insulating layers or materials placed on the sidewalls of the gate regions. The spacers 332 can help control the effective channel length of the passive device 300A. In an embodiment, the spacers 332 can allow for control over the channel's conductive properties, including resistance and carrier mobility, which can contribute to improved performance of the passive device 300A. The spacers 332 can be a low-k material.

In some embodiments, the spacers 332 can act as insulating layers between the gate regions 322 and the plurality of N-type doped sections 314A and the plurality of P-typed doped sections 314B. That is, the spacers 332 can help prevent current leakage or short circuits between the gate regions 322 and the plurality of N-type doped sections 314A and the plurality of P-typed doped sections 314B. Such isolation can help maintain the integrity of the passive device's electrical operation and prevent unintended current flow that could negatively impact the performance of the passive device 320A and reliability.

In further embodiments, the spacers 332 can be utilized to modulate the overlapping capacitance between the gate regions 322 and the plurality of N-type doped sections 314A and the plurality of P-typed doped sections 314B. Overlapping capacitance can affect the passive device's electrical characteristics, such as threshold voltage and switching behavior. Thus, by adjusting the thickness and material properties of the spacers 332 the overlapping capacitance can be optimized, which can allow for better control and modulation of the passive device's behavior. In several embodiments, the spacers 332 can help mitigate the short-channel effects by physically separating the gate regions 322 from the plurality of N-type doped sections 314A and the plurality of P-typed doped sections 314B. To that end, the spacers 332 can create a barrier that restricts the extension of the electric field into the channel region. This mitigation can improve the passive device's performance, reduce power consumption, and enhance overall device reliability.

In an embodiment, the spacers 332 can serve as barriers that prevent the lateral diffusion of dopant atoms from the plurality of N-type doped sections 314A and the plurality of P-typed doped sections 314B, into the channel region during the doping process. Such diffusion can alter the channel characteristics and compromise the passive device's performance. By confining the dopant diffusion, the spacers 332 can contribute to maintaining the desired passive device's characteristics and electrical behavior. In some embodiments, the spacers 332 can be formed over the sidewalls of the gate regions 322. The spacers 332 can be formed by deposition techniques. Alternatively, the spacers 332 can be formed by etching or selectively epitaxially growing the spacers 332 over the sidewalls of the gate regions 322. In various embodiments, the spacers 332 can include SiGe.

In an embodiment, the inner spacer 334, similar to the spacers 332, can act as insulating layers between the gate regions and the plurality of N-type doped sections 314A and the plurality of P-typed doped sections 314B. In various embodiments, the inner spacer 334 can be the same as the spacers 332, which are formed over portions of the gate regions 322 confined between the NS 318.

In some embodiments, one or more of the STI 346, the spacers 332, and the inner spacers 334 can be made of SiN. The ILD 330 can be made of SiO2. In various embodiments, the plurality of N-type doped sections 314A and the plurality of P-typed doped sections 314B can extend through the SASI 336 and connect to the N-well 310B or the P-well 310A. In some embodiments, the passive device 300A can include one or more sacrificial placeholders, PH 312 within the P-well 310A or the N-well 310B and below the plurality of N-type doped sections 314A and the plurality of P-typed doped sections 314B.

In some embodiments, carrier wafer bonding, also known as wafer-to-wafer bonding or chip-to-wafer bonding, is performed to join two semiconductor devices together by creating a permanent bond between them. In some embodiments, the two semiconductor devices can be brought into contact and bonded at the atomic or molecular level, to create an interface. In an embodiment, the two semiconductor devices are brought into contact under controlled conditions, such as controlled pressure and temperature, to enable atomic or molecular bonding at the interface. Such bonding can be done at room temperature or with elevated temperatures. Alternatively, in some embodiments, an electric field and elevated temperature are utilized to create a bond. One semiconductor device can be made of semiconductor material, while the other can be a glass or silicon dioxide (SiO2) wafer. The electric field can cause ions in the glass or SiO2 to migrate and chemically bond with the semiconductor material in the other semiconductor device. In additional embodiments, a thin metal layer or metal alloy can be used as an intermediate bonding layer between the semiconductor devices.

Figure 4A:
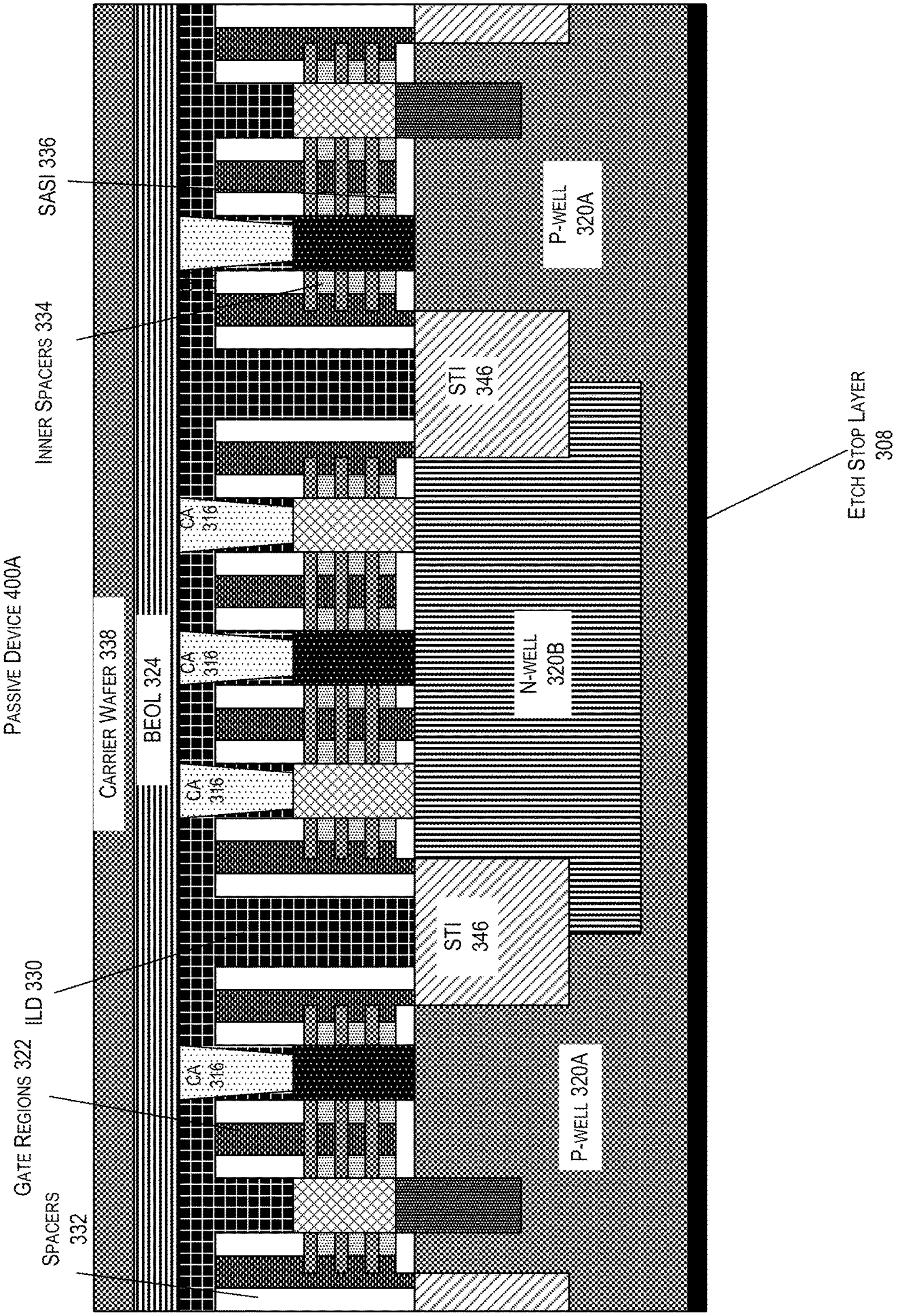
FIGS. 4A-4B illustrate a semiconductor device after the removal of the substrate, in accordance with some embodiments.
Figure 4B:
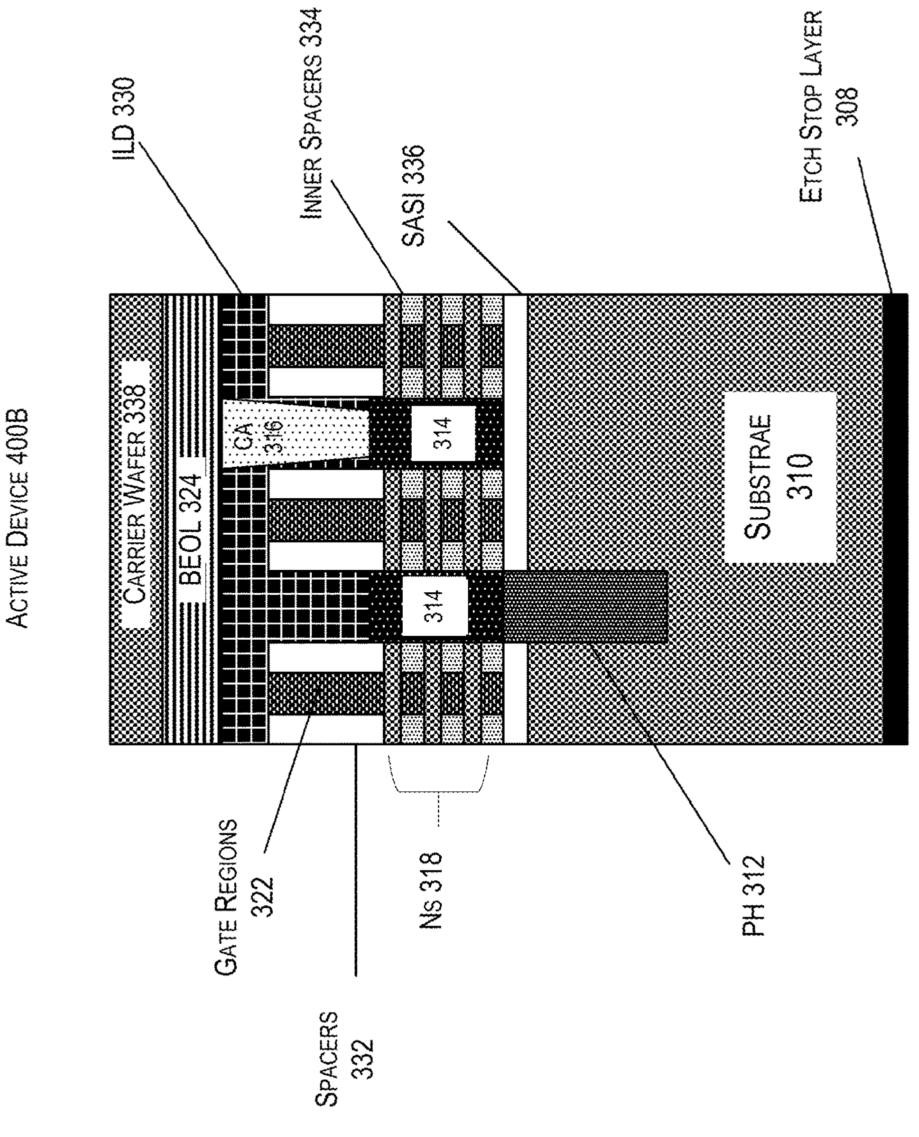

FIGS. 4A-4B illustrate a semiconductor device after the removal of the substrate, in accordance with some embodiments. In some embodiments, the wafer is flipped, and the substrate is removed. It should be noted that, for the sake of simplicity, the semiconductor device is not shown as flipped. The etching stops at the etch stop layer 308.

Figure 5A:
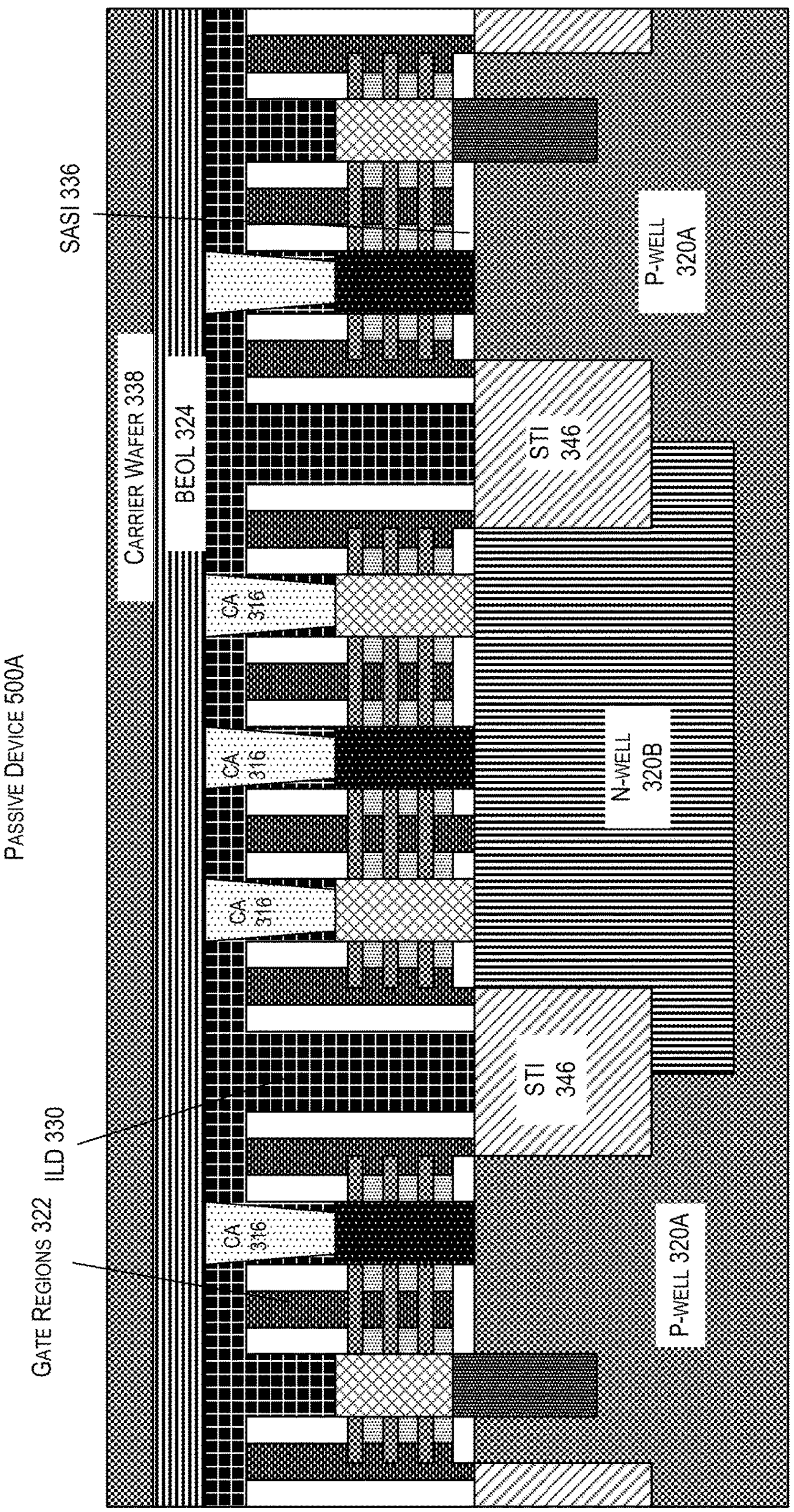
FIGS. 5A-5B illustrate a semiconductor device after removal of the etch stop layer, in accordance with some embodiments.
Figure 5B:
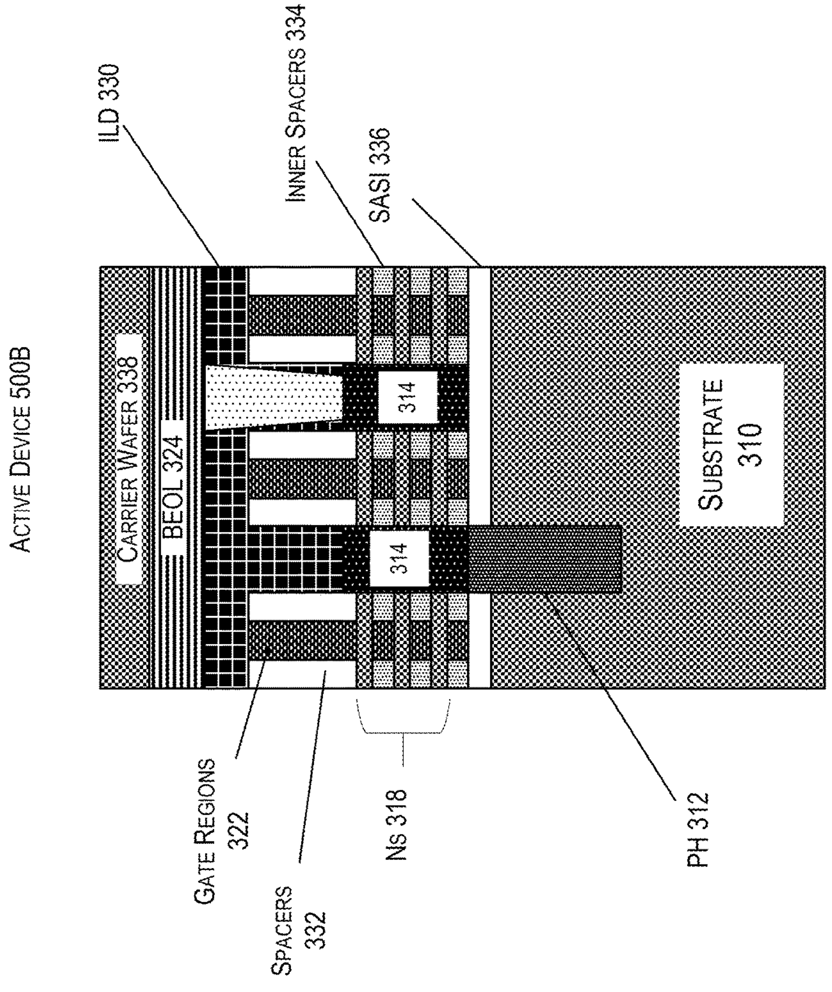

FIGS. 5A-5B illustrate a semiconductor device after the after the removal of the etch stop layer, in accordance with some embodiments. In some embodiments, the etch stop layer is removed.

Figure 6A:
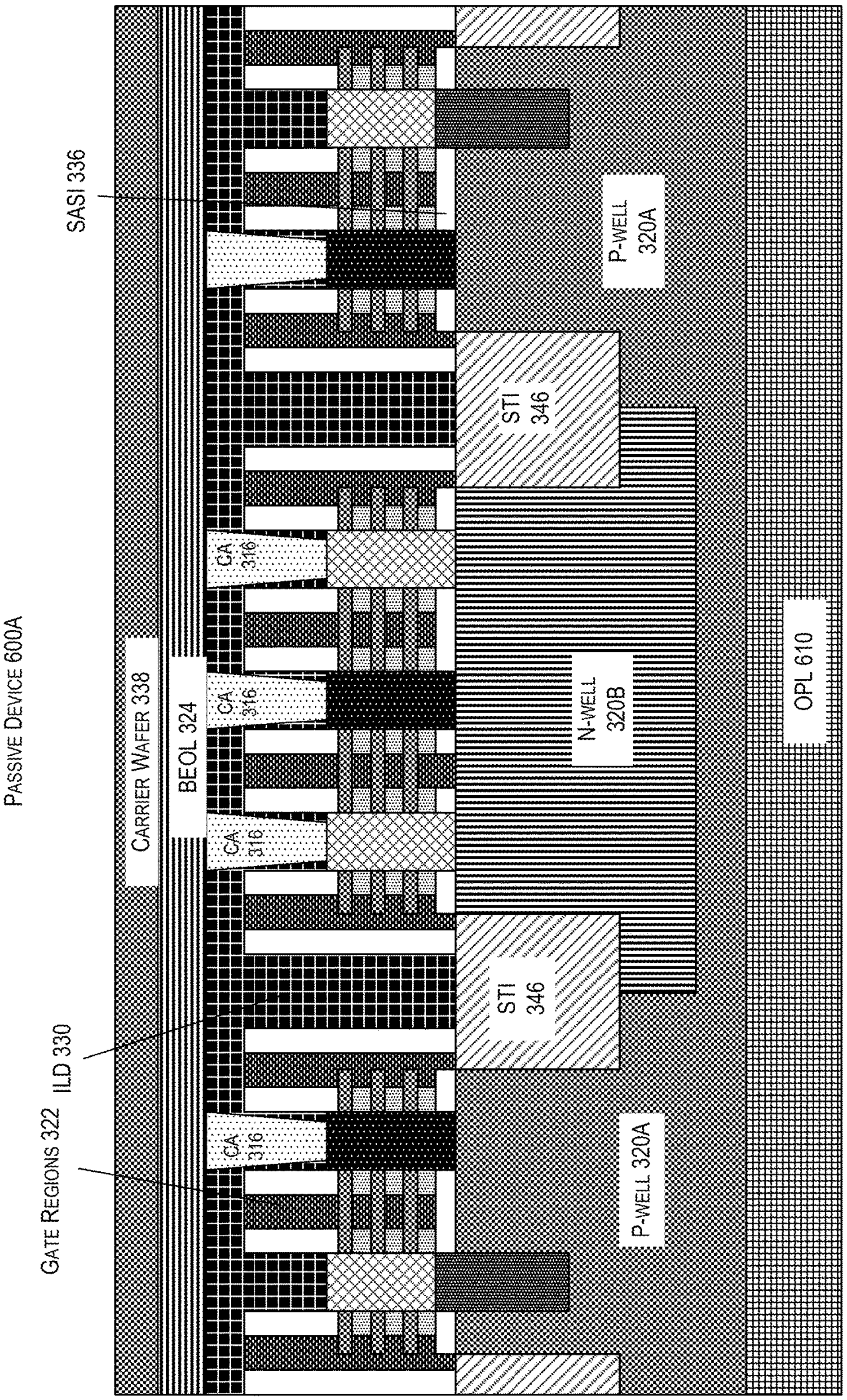
FIGS. 6A-6B illustrate a semiconductor device after patterning of the backside contact, in accordance with some embodiments.
Figure 6B:
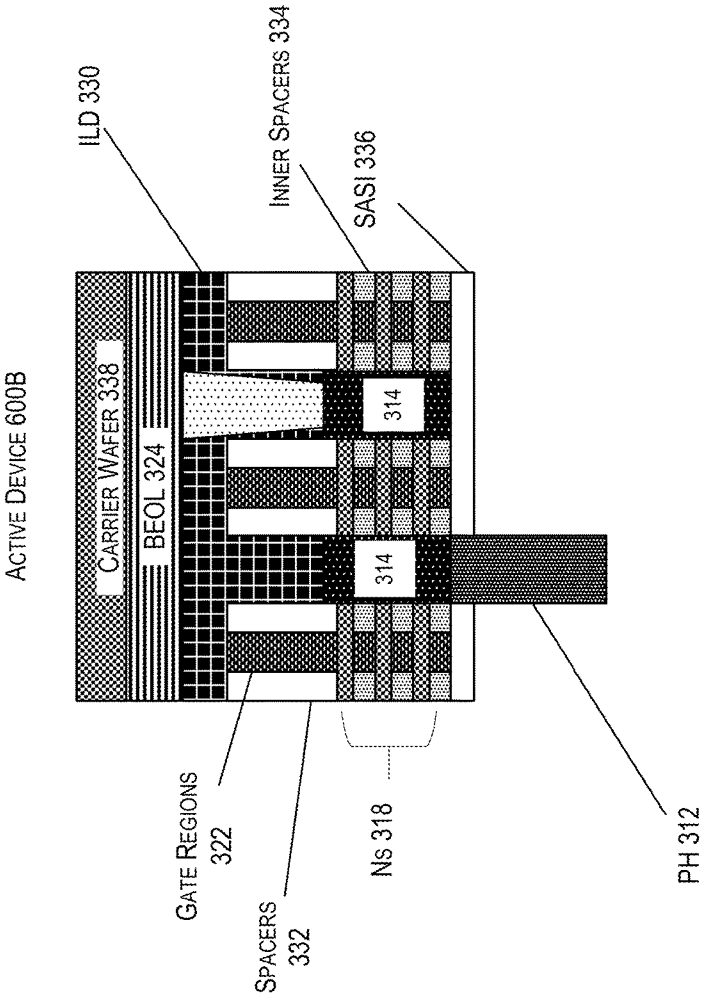

FIGS. 6A-6B illustrate a semiconductor device after the patterning of the backside of the active device, in accordance with some embodiments. In some embodiments, an organic planarization layer, OPL 610, covers the passive device 600A to preserve the passive device in this step. Afterwards, the backside of the active device 600B is patterned by removing the substrate 348 and exposing the PH 312 and the SASI 336.

Figure 7A:
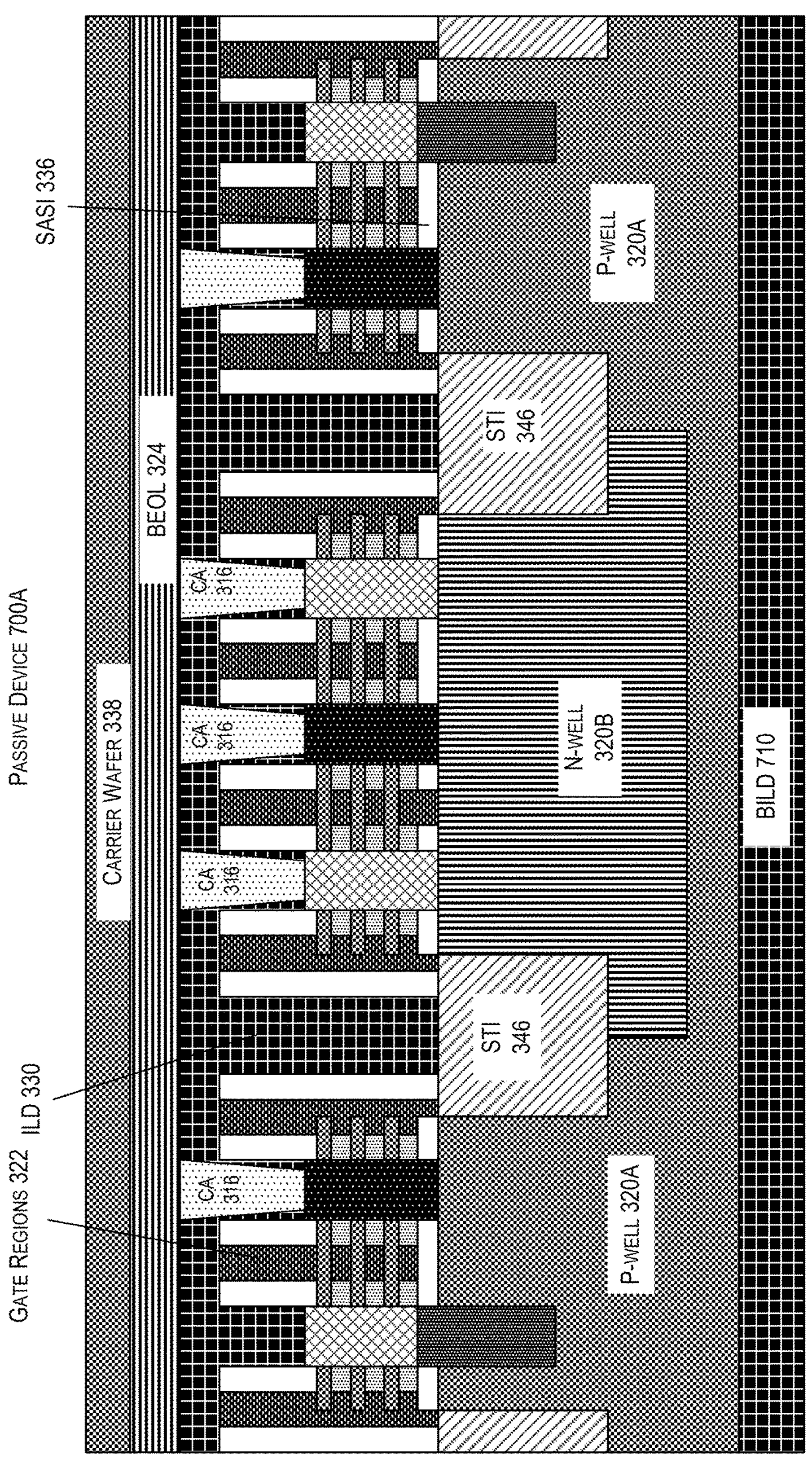
FIGS. 7A-7B illustrate a semiconductor device after the formation of the bottom interlayer dielectric, in accordance with some embodiments.
Figure 7B:
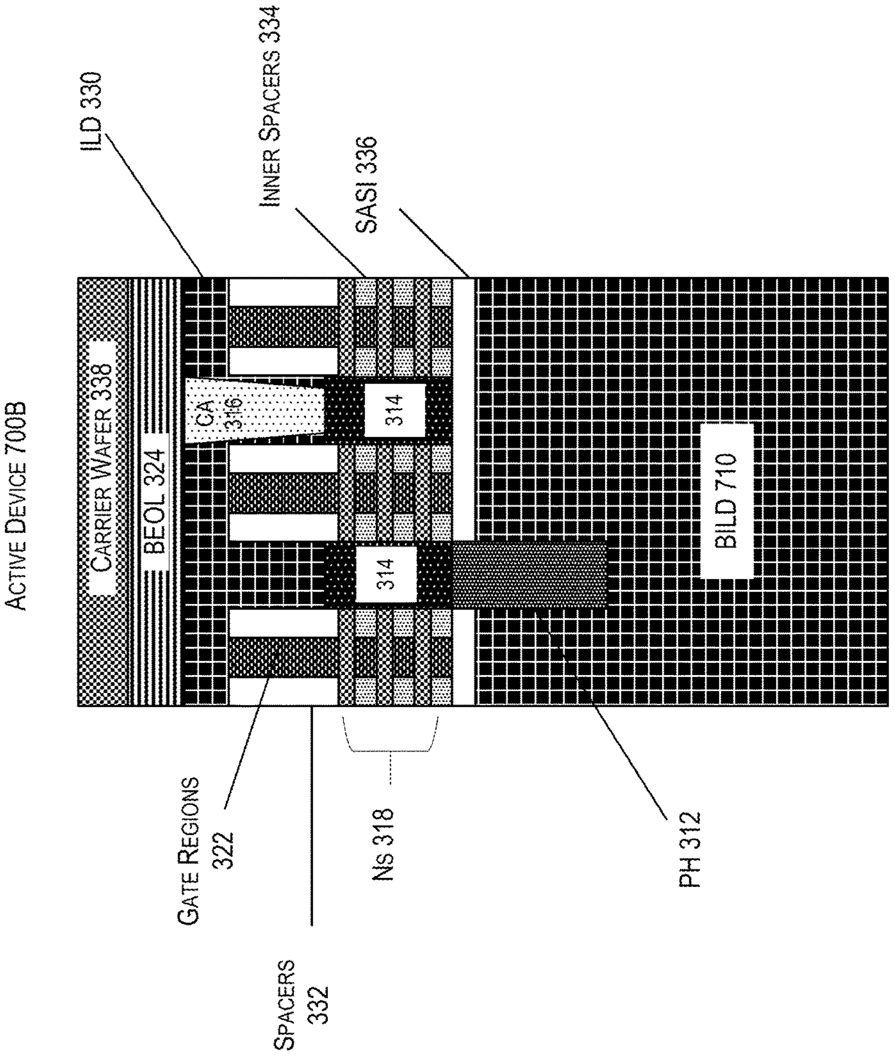

FIGS. 7A-7B illustrate a semiconductor device after the after the formation of the bottom interlayer dielectric, in accordance with some embodiments. In some embodiments, the OPL is removed and the backside dielectric, BILD 710, is formed over both the passive device 700A and the active device 700B. The BILD 710 can be an insulating material or layer used to isolate and provide electrical insulation between the semiconductor device's active regions and the PH 312. In various embodiments, the BILD 710 can function as a protective layer, shielding the active regions of the semiconductor device from external contaminants, moisture, and mechanical stress. The BILD 710 can further help prevent physical damage, such as scratches or particle contamination, which could adversely affect semiconductor device performance. Additionally, the BILD 710 can function as a barrier against moisture ingress, which can cause corrosion and degradation of the semiconductor device's components. The BILD 710 can be made of SiO2. In an embodiment, a chemical-mechanical polishing (CMP) process is further processed after the formation of the BILD 710.

Figure 8A:
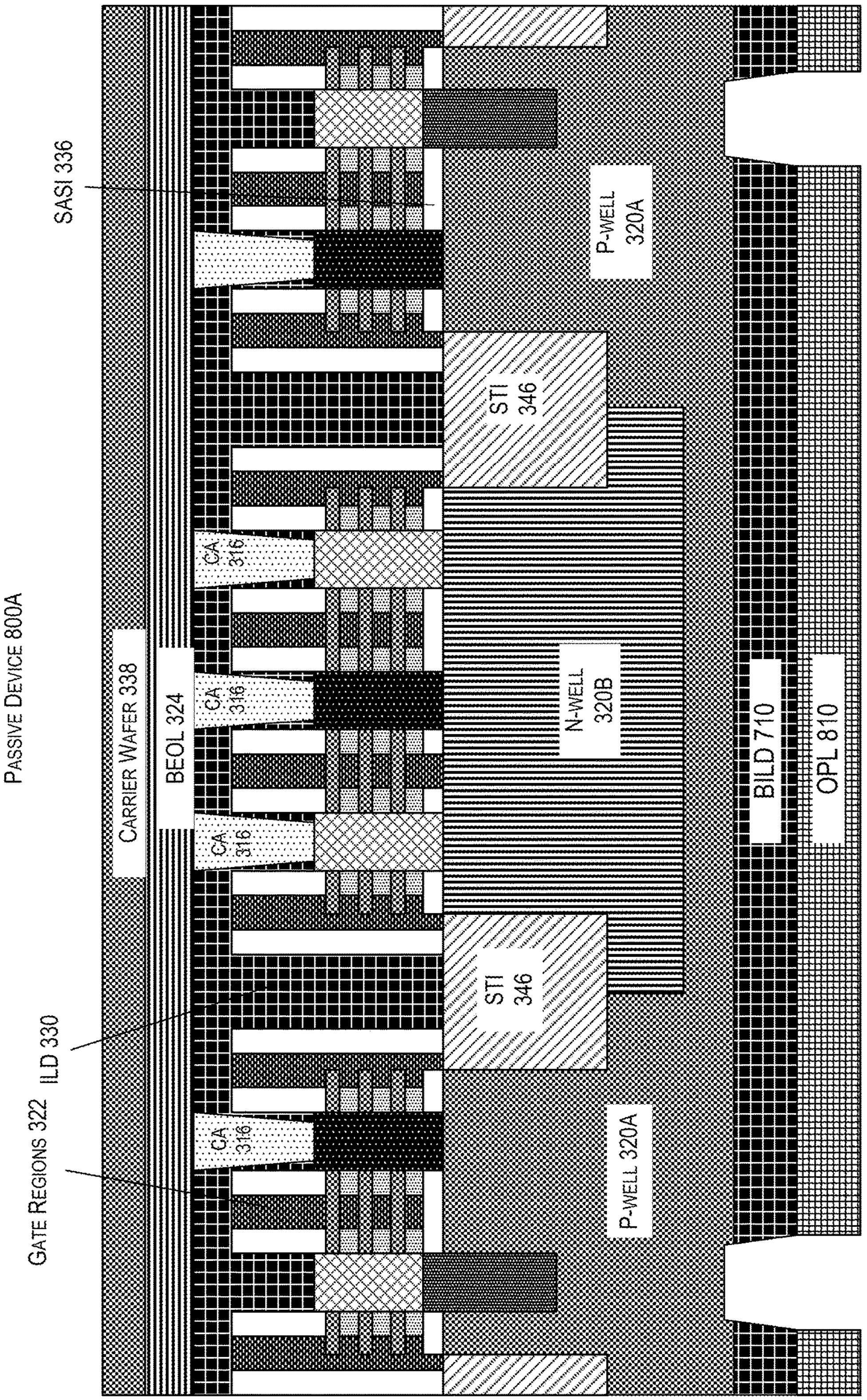
FIGS. 8A-8B illustrate a semiconductor device after the patterning of the backside contact, in accordance with some embodiments.
Figure 8B:
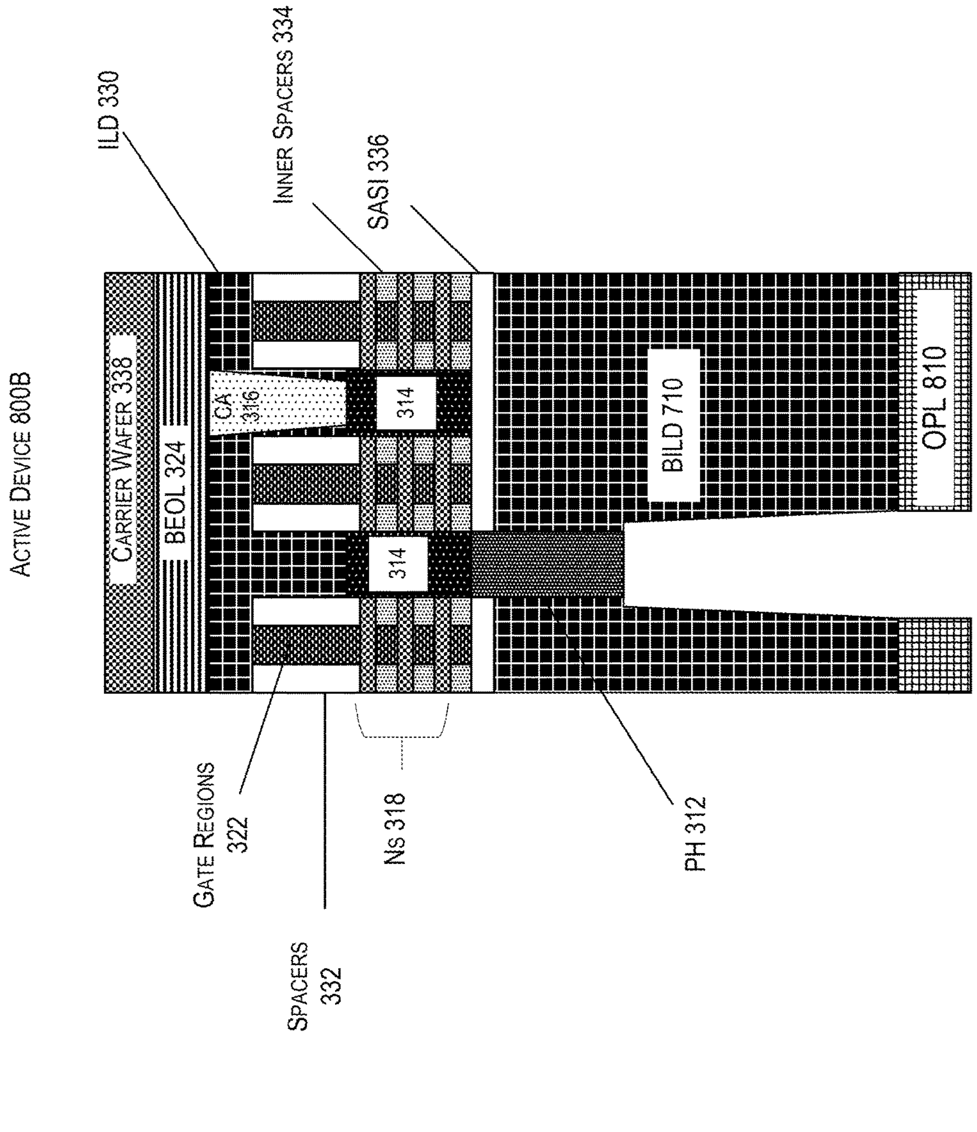

FIGS. 8A-8B illustrate a semiconductor device after the patterning of the backside contact, in accordance with some embodiments. In some embodiments, an OPL 810 is formed over the semiconductor device. The OPL 810 can include a photo-sensitive organic polymer having a light-sensitive material that, when exposed to electromagnetic radiation, is chemically altered and thus configured to be removed using a developing solvent. For example, in some embodiments, the photo-sensitive organic polymer can be polyacrylate resin, epoxy resin, phenol resin, polyamide resin, polyimide resin, unsaturated polyester resin, polyphenylenether resin, polyphenylenesulfide resin, or benzocyclobutene. In some embodiments, the OPL 810 can include any organic polymer and a photoactive compound having a molecular structure that can attach to the molecular structure of the organic polymer. In some embodiments, the OPL 810 material is selected to be compatible with an overlying antireflective coating and/or an overlying photoresist. In some embodiments, the OPL 810 can be applied using spin coating technology, although other techniques are within the contemplated scope of the present disclosure. The backside contact patterning is performed by removing portions of the OPL 810 and the BILD 710. In the passive device 800A, the patterning stops at the P-well 310A or the N-well 310B. In the active device 800B, the patterning stops at the surface of the PH 312.

Figure 9A:
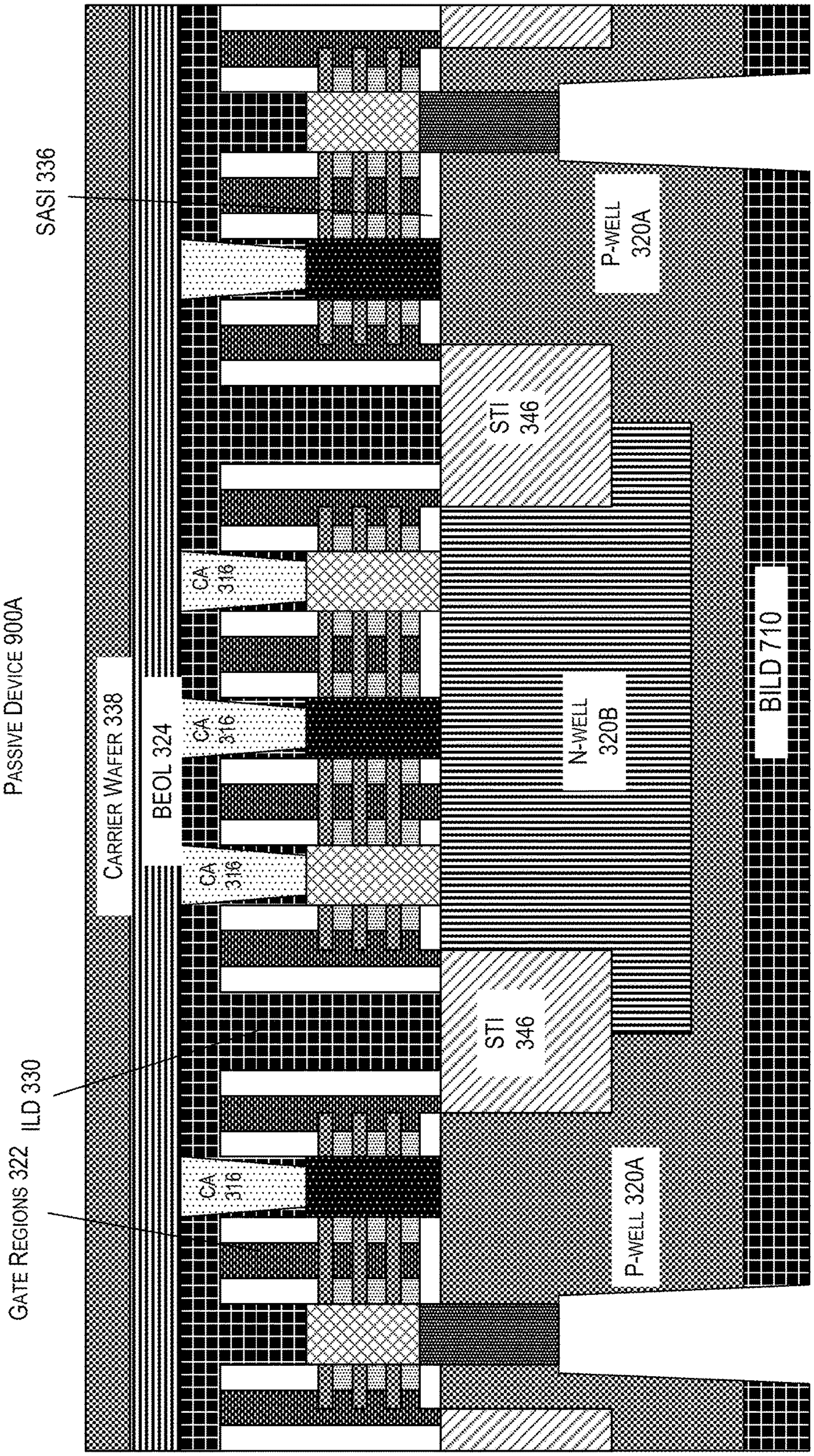
FIGS. 9A-9B illustrate a semiconductor device after the etching the substrate from the passive device, in accordance with some embodiments.
Figure 9B:
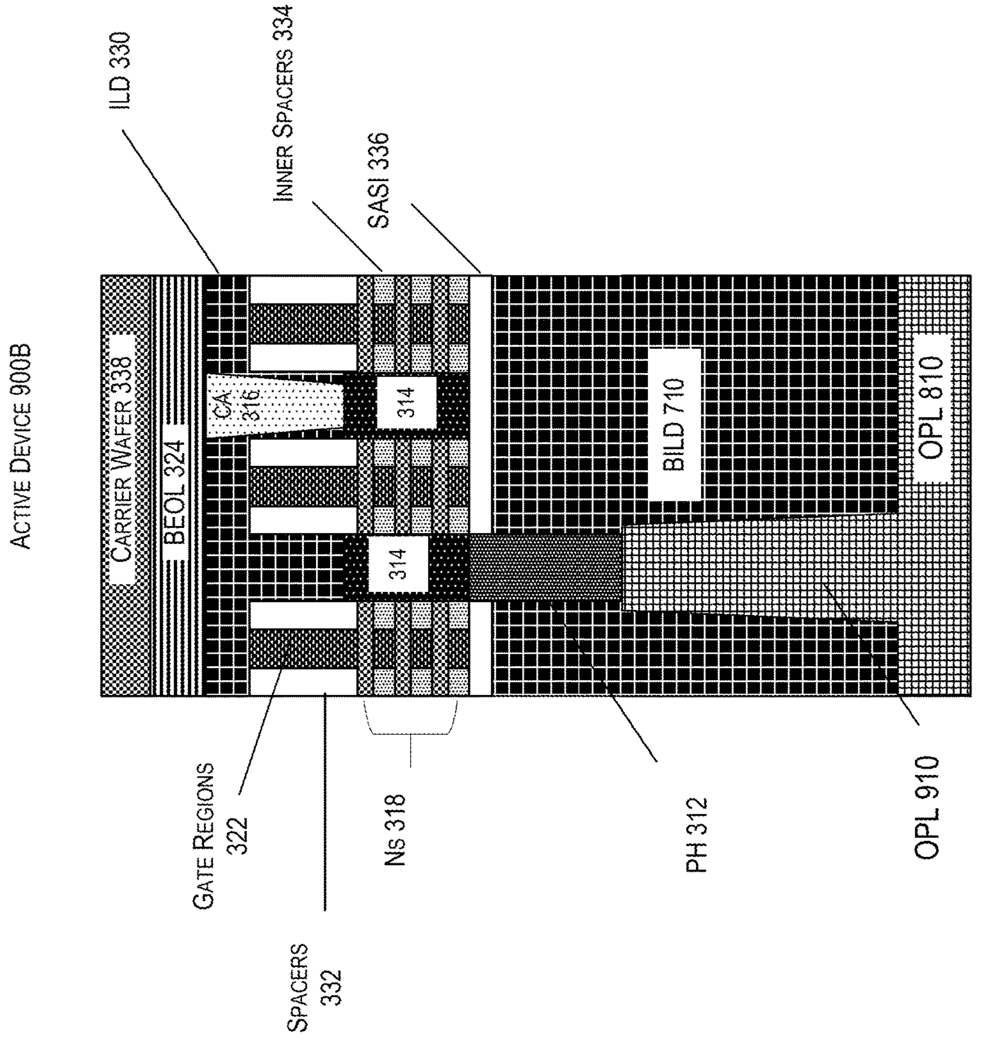

FIGS. 9A-9B illustrate a semiconductor device after the removal of organic planarization layer, in accordance with some embodiments. In some embodiments, the OPL is removed from the surface of the passive device 900A to create a flat surface for subsequent lithography and deposition steps. It should be noted that, the OPL 810 still remains over the active device 900B. In various embodiments, additional OPL 910 fills the recessed area that is formed by patterning the backside contact.

Figure 10A:
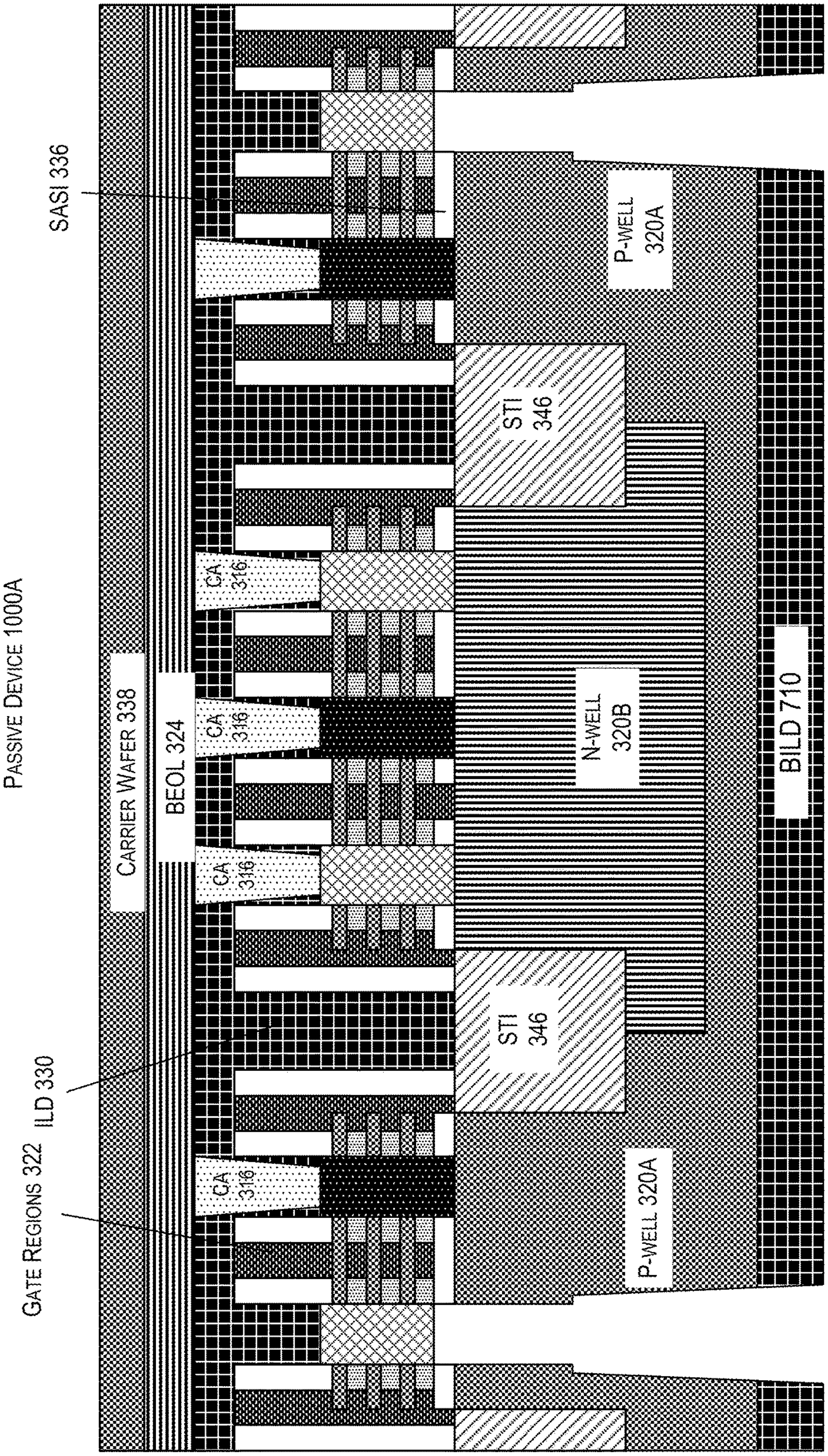
FIGS. 10A-10B illustrate a semiconductor device after the removal of the sacrificial placeholders, in accordance with some embodiments.
Figure 10B:
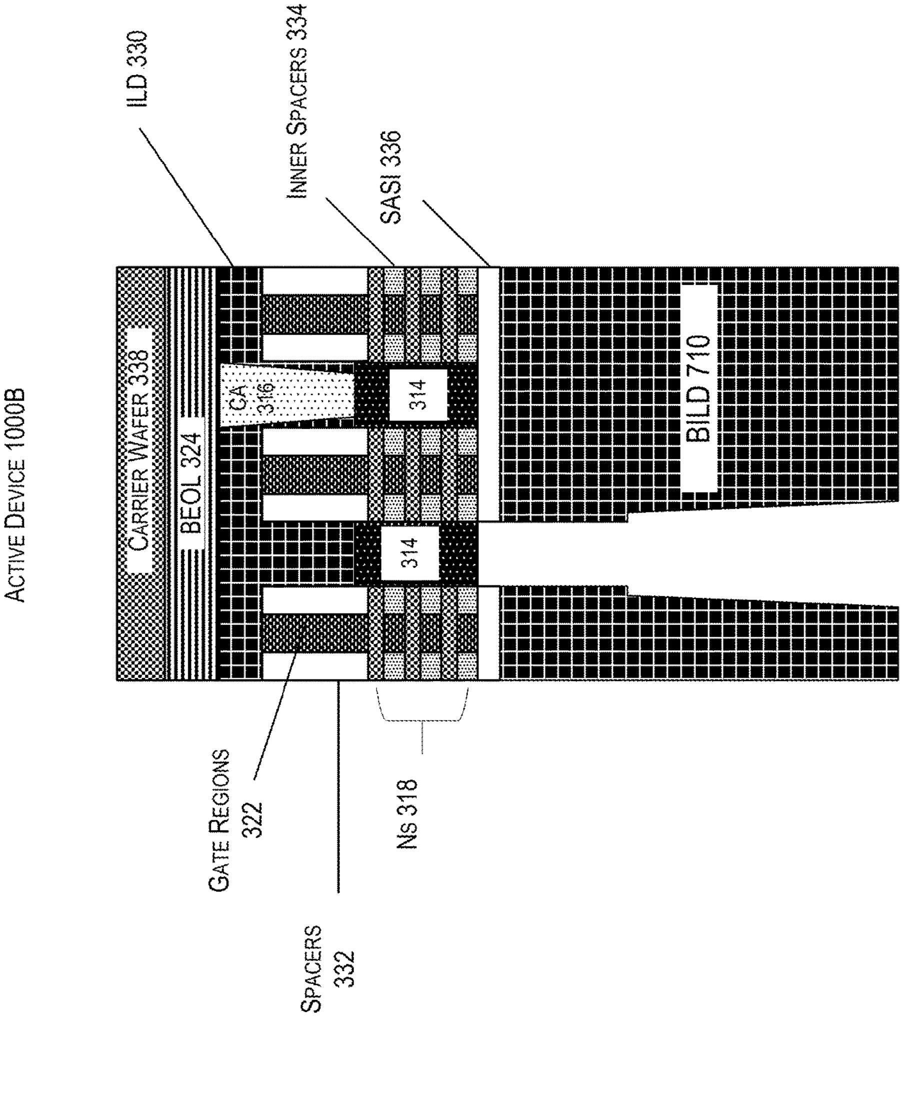

FIGS. 10A-10B illustrate a semiconductor device after the removal of the sacrificial placeholders, in accordance with some embodiments. In some embodiments, the OPL 810 and the additional OPL 910 are removed from the active device 1000B. Then, the PH 312 and portions of SASI 336 are removed selectively to expose the bottom of the plurality of N-type doped sections 314A and the plurality of P-typed doped sections 314B in the passive device 1000A and the bottom of the source/drain region in the active device 1000B.

Figure 11A:
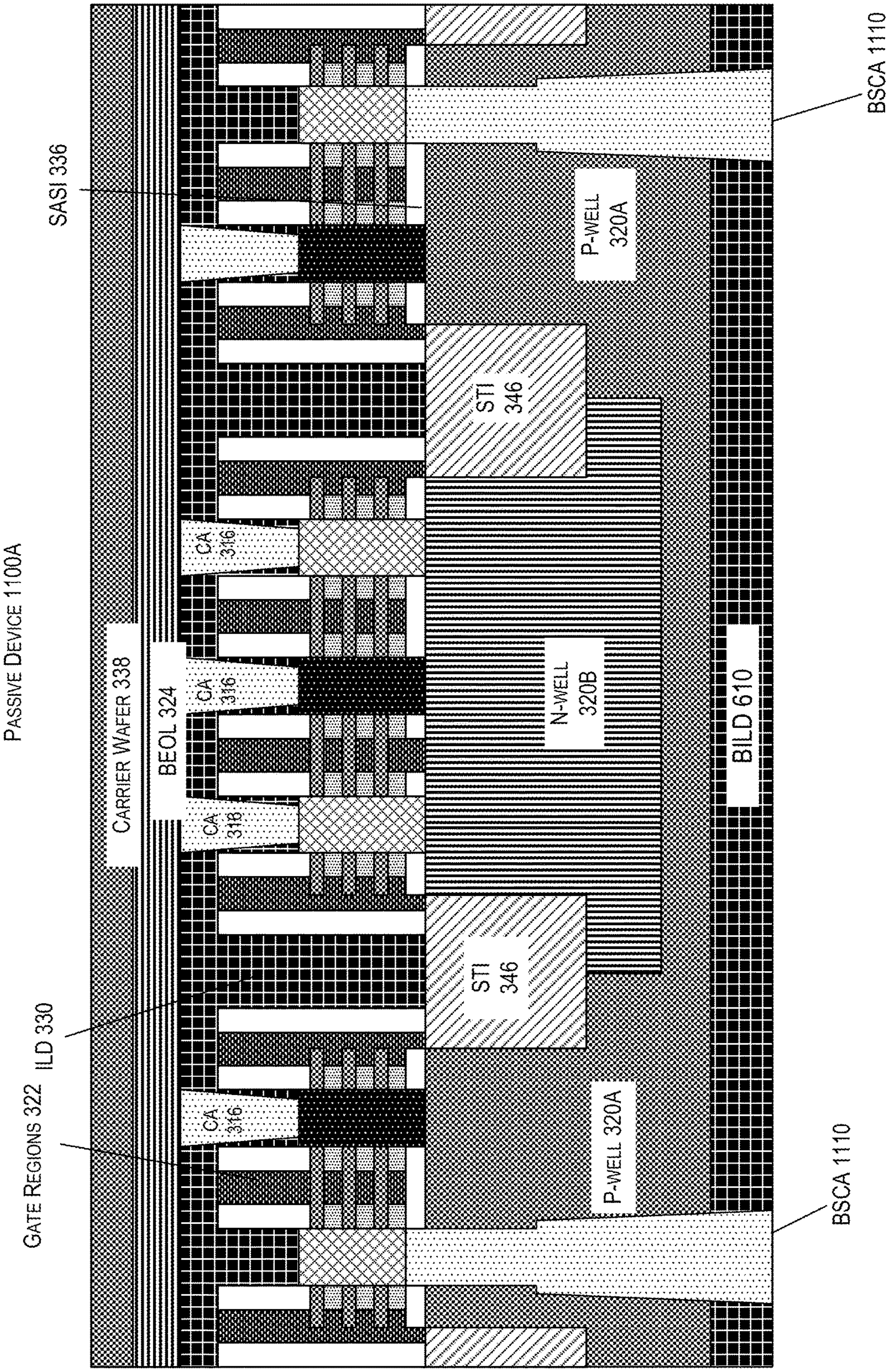
FIGS. 11A-11B illustrate a semiconductor device after the metallization of the backside contact, in accordance with some embodiments.
Figure 11B:
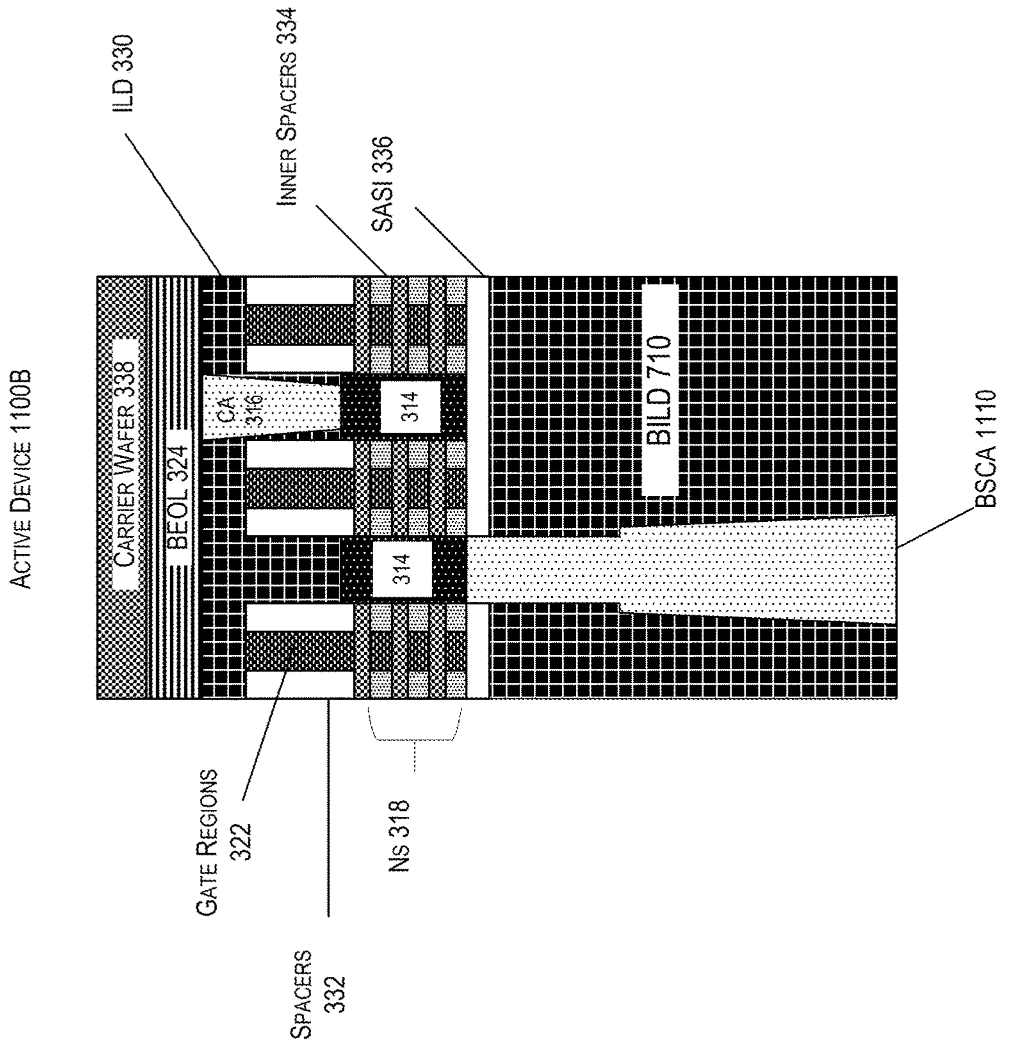

FIGS. 11A-11B illustrate a semiconductor device after the backside contact metallization, in accordance with some embodiments. In some embodiments, the backside contacts, BSCA 1110, by filling the recessed areas with a suitable metal. The BSCA 1110 are surrounded in by the P-well 310A or the N-well 310B in the passive device 1100A or the BILD 710 in the active device 1100B.

Figure 12A:
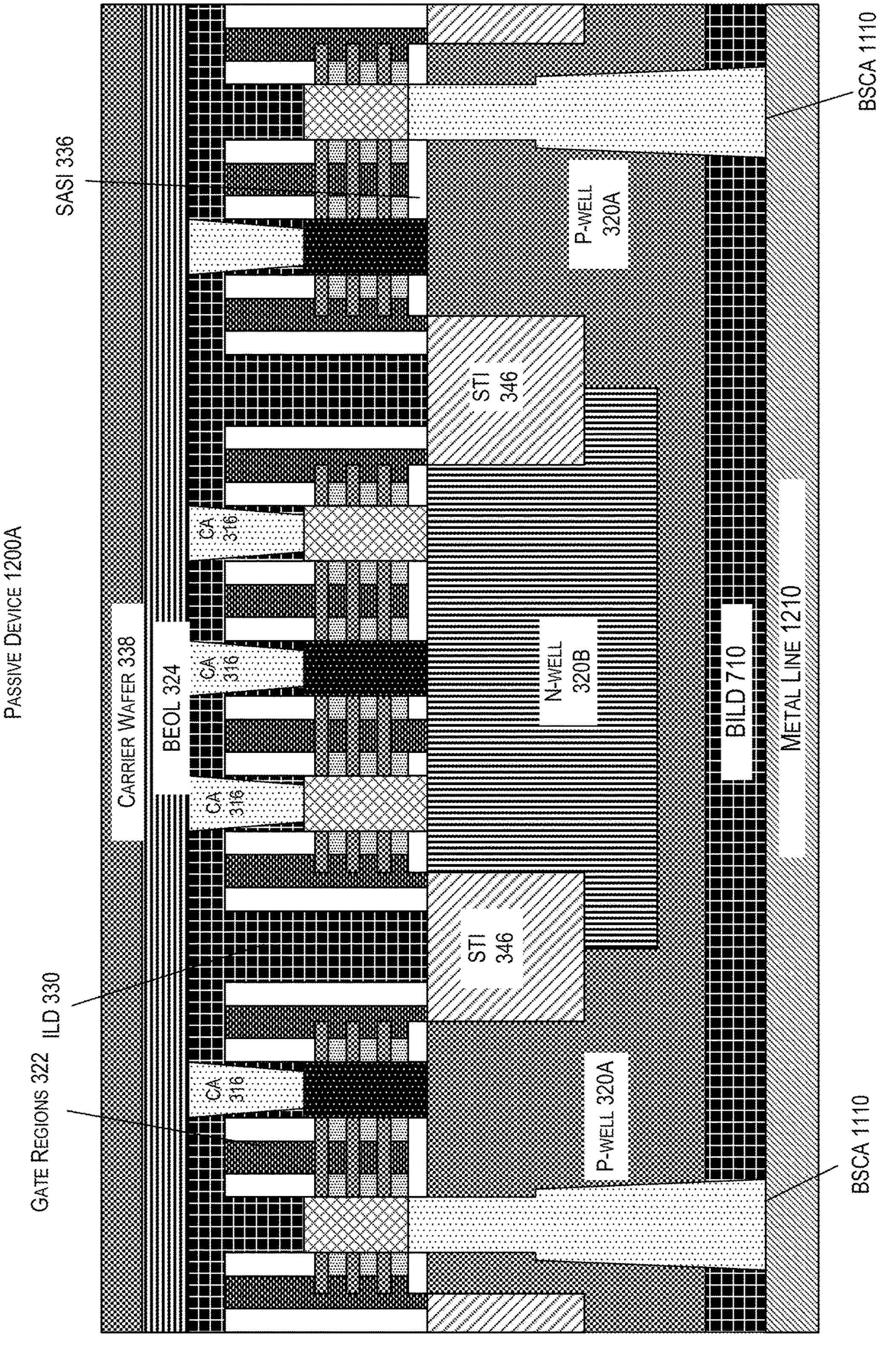
FIGS. 12A-12B illustrate a semiconductor device after the formation of the backside metal layer, in accordance with some embodiments.
Figure 12B:
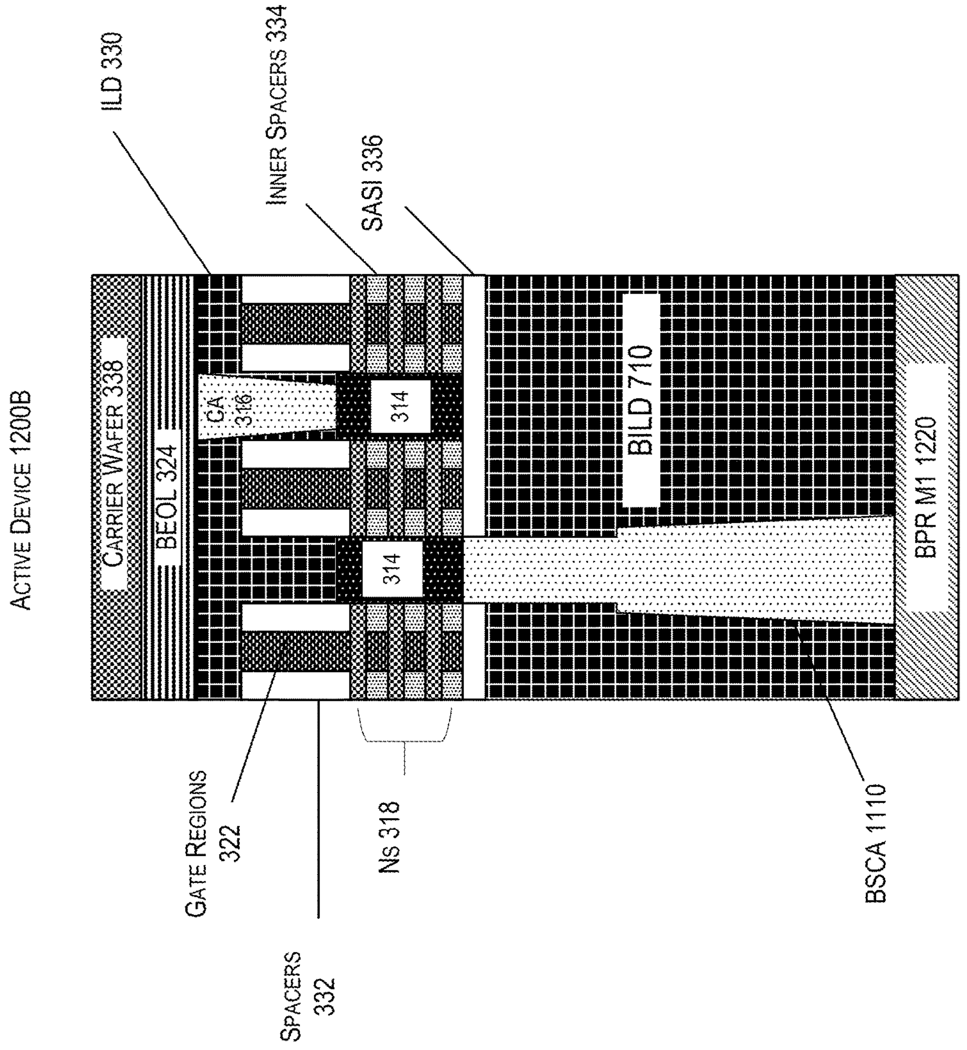

FIGS. 12A-12B illustrate a semiconductor device after the formation of the backside metal lines, in accordance with some embodiments. In some embodiments, a backside metal line, metal line 1210, is formed over the BILD 710 in the passive device 1200A. The metal line 1210 can be used for voltage reference purposes. Similarly, a backside power rail metal line, BPR M1 1220, can be formed in the active device 1200B.

Figure 13A:
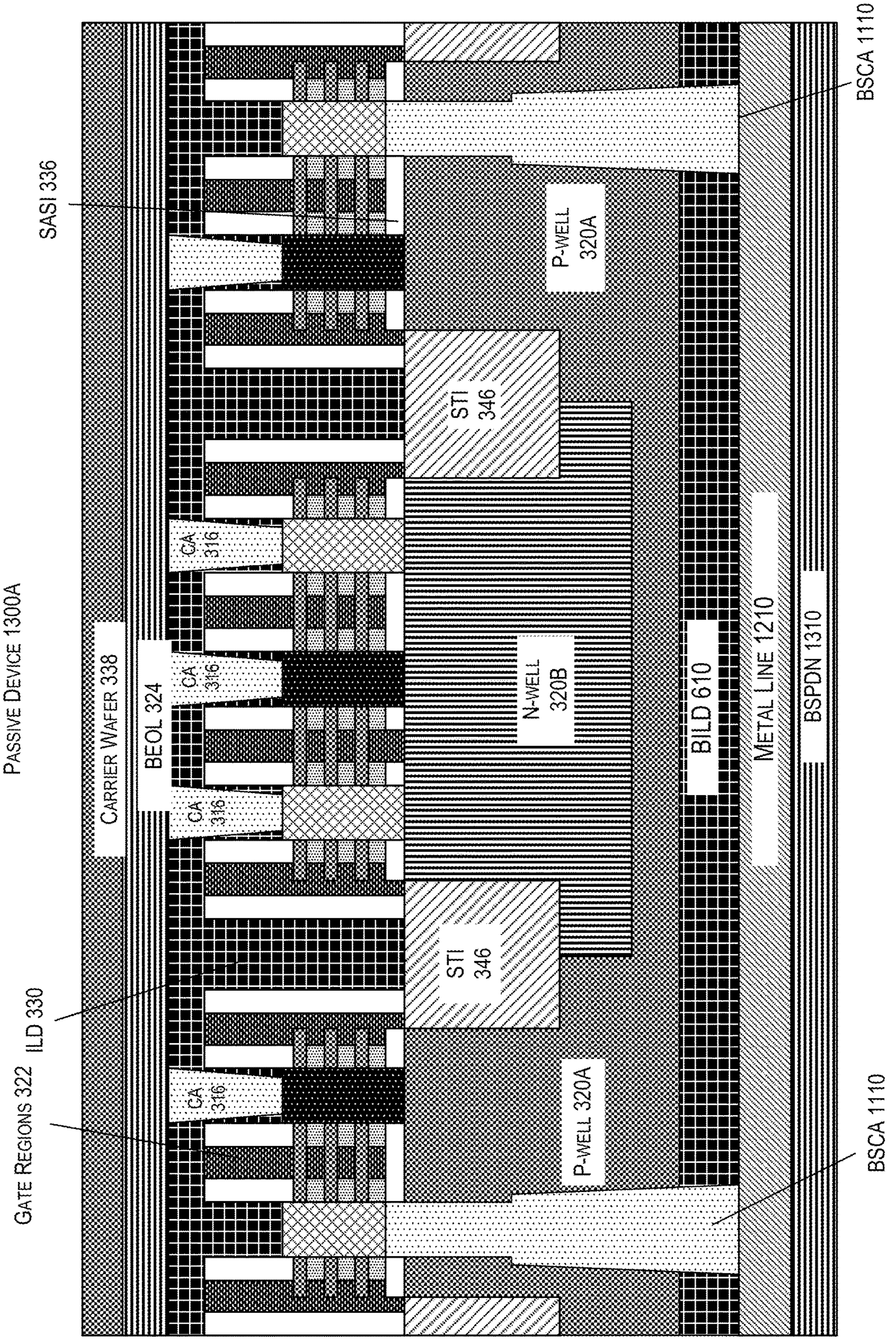
FIGS. 13A-13B illustrate a semiconductor device after the formation of the backside power delivery network, in accordance with some embodiments.
Figure 13B:
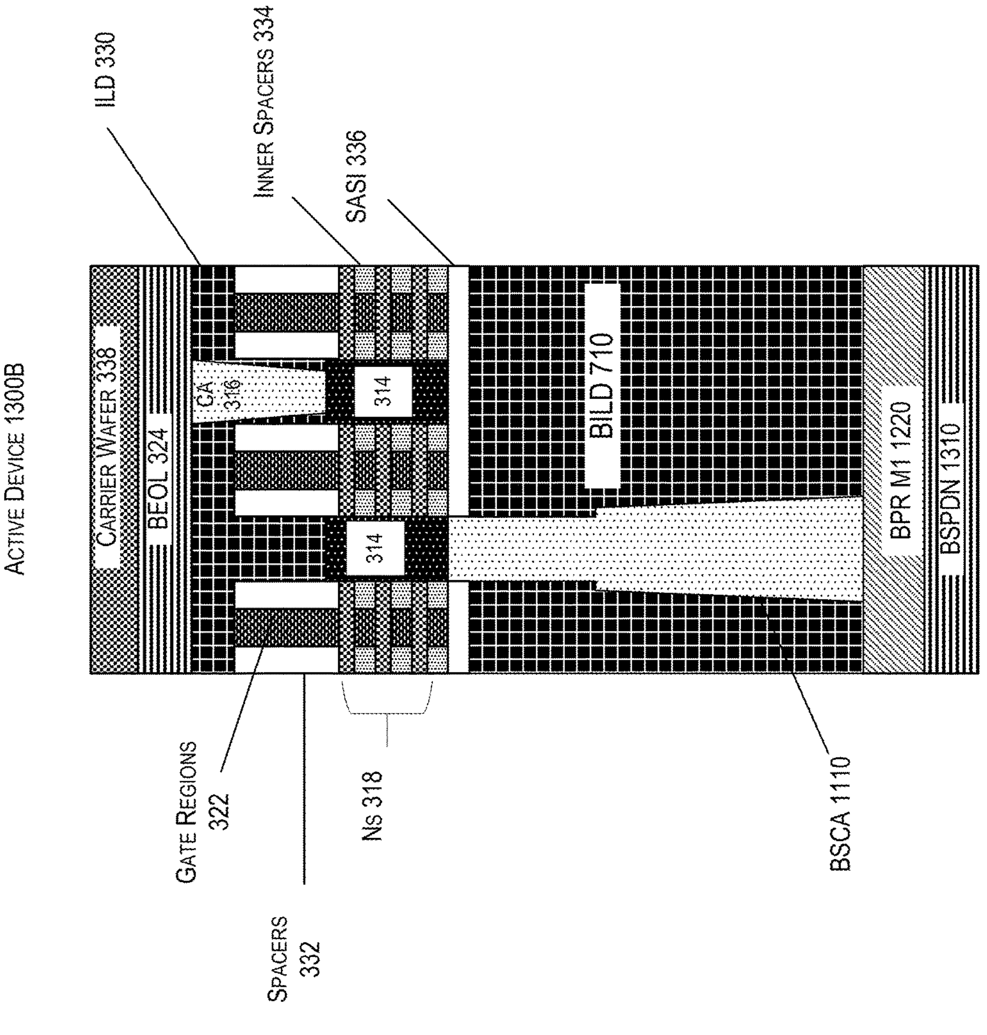

FIGS. 13A-13B illustrate a semiconductor device after the formation of a backside power delivery network, in accordance with some embodiments. In some embodiments, a backside power delivery network, BSPDN 1310, is formed over the metal line 1210 in the passive device 1300A and BPR M1 1220 in the active device 1300B. The BSPDN 1310 can connect the semiconductor device to other devices.

Figure 14:
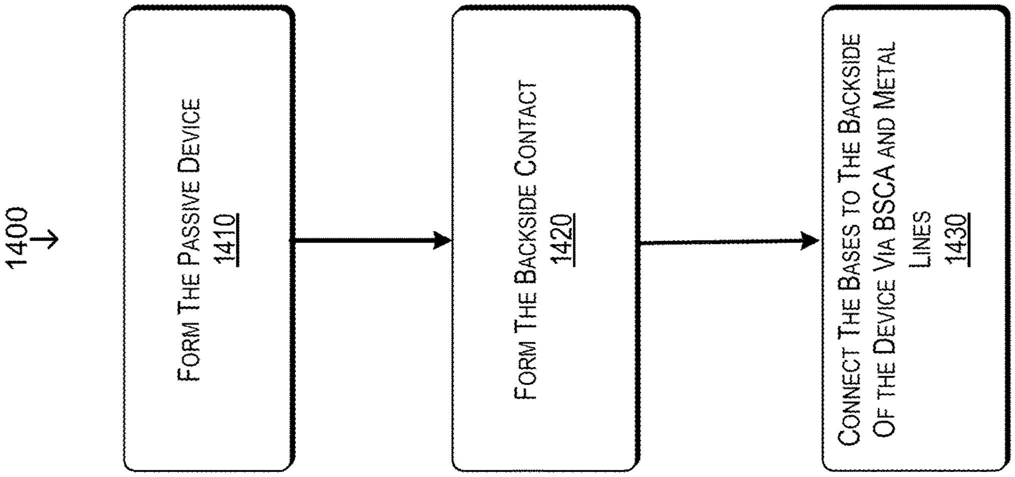
FIG. 14 illustrates a block diagram of a method for forming the semiconductor device, in accordance with some embodiments.

FIG. 14 illustrates a block diagram of a method 1400 for forming the semiconductor device, in accordance with some embodiments. As shown by block 1410, the passive device is formed. The passive device includes emitters, collectors and bases.

As shown by block 1420, the backside contacts are formed.

As shown by block 1430, the plurality of bases is connected to a backside of the semiconductor device via the backside contacts and a metal line on a backside of the semiconductor device.

In one aspect, the method and structures described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip may be mounted in a single chip package (such as a plastic carrier, with leads that are affixed to a motherboard or other higher-level carrier) or in a multichip package (such as a ceramic carrier that has either or both surface interconnections or buried interconnections). In any case, the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications, such as toys, to advanced computer products having a display, a keyboard or other input device, and a central processor.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications, and variations that fall within the true scope of the present teachings.

The components, steps, features, objects, benefits, and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, the inventive subject matter lies in less than all features of a single disclosed embodiment. Thus, the following claims are hereby incorporated into the Detailed Description, with each claim standing on its own as a separately claimed subject matter.

What is claimed is:

1. A semiconductor device, comprising:
- a passive device comprising:
  - a plurality of emitters;
  - a plurality of collectors;
  - a plurality of bases;
  - a plurality of backside contacts connecting the plurality of bases to a backside of the semiconductor device, wherein the plurality of bases are connected to each other via the plurality of backside contacts and a metal line on the backside of the semiconductor device; and
- a first well and a second well, wherein:
- a first backside contact of the plurality of backside contacts is directly connected to the first well; and
- a second backside contact of the plurality of backside contacts is directly connected to the second well.

2. The semiconductor device of claim 1, wherein the first backside contact and the second backside contact are directly connected to the metal line.

3. The semiconductor device of claim 1, wherein the first well and the second well are N-type wells.

4. The semiconductor device of claim 1, wherein the first well and the second well are P-type wells.

5. The semiconductor device of claim 1, further comprising a logic device, wherein the logic device includes a backside contact surrounded by a backside interlayer dielectric.

6. The semiconductor device of claim 1, wherein the semiconductor device is an electro-static discharge (ESD) lateral NPN device, or an EDS lateral PNP device.

7. The semiconductor device of claim 1, wherein the semiconductor device is an electro-static discharge ESD N-channel field-effect transistor (ESD NFET), an ESD P-Channel FET (ESD PFET), or a bipolar junction transistor (BJT).

8. The semiconductor device of claim 1, wherein the metal line has a bias potential or a ground potential.

9. A method for fabrication of a semiconductor device, the method comprising:
- forming a passive device comprising a plurality of emitters, a plurality of collectors, and a plurality of bases;
- forming a plurality of backside contacts;
- connecting the plurality of bases to a backside of the semiconductor device via the
- plurality of backside contacts and a metal line on the backside of the semiconductor device;
- forming a first well and a second well;
- directly connecting a first backside contact of the plurality of backside contacts to the first well; and
- directly connecting a second backside contact of the plurality of backside contacts to the second well.

10. The method of claim 9, wherein the first well and the second well are P-type wells.

11. The method of claim 9, wherein the first well and the second well are N-type wells.

12. The method of claim 9, further comprising:
- directly connecting the first backside contact to the metal line; and
- directly connecting the second backside contact to the metal line.

13. The method of claim 9, further comprising forming a logic device, wherein the logic device includes a backside contact surrounded by a backside interlayer dielectric.

14. The method of claim 9, wherein the semiconductor device is an electro-static discharge (ESD) lateral NPN device, an EDS lateral PNP device, an ESD N-channel field-effect transistor (NFET), an ESD P-Channel FET (PFET), or a bipolar junction transistor (BJT).

15. The method of claim 9, further comprising establishing a bias potential or a ground potential for the metal line.

16. A semiconductor device, comprising:
- a passive device including a plurality of backside contacts;
- a silicon layer surrounding the plurality of backside contacts; and
- a metal layer connected to the plurality of the backside contacts on a backside of the semiconductor device, wherein the metal layer is configured to act as a voltage reference.

17. The semiconductor device of claim 16, further comprising a logic device, wherein the logic device includes a backside contact surrounded by a backside interlayer dielectric.

18. The semiconductor device of claim 16, wherein the silicon layer includes a P-type well or an N-type well.

* * * * *